United States Patent [19]
Pulyer

[11] Patent Number: 5,914,600
[45] Date of Patent: Jun. 22, 1999

[54] PLANAR OPEN SOLENOIDAL MAGNET MRI SYSTEM

[75] Inventor: Yuly M. Pulyer, Revere, Mass.

[73] Assignee: Brigham and Women's Hospital, Boston, Mass.

[21] Appl. No.: 08/869,009

[22] Filed: Jun. 4, 1997

[51] Int. Cl.[6] .................................................. G01V 3/00
[52] U.S. Cl. .......................................... 324/319; 324/320
[58] Field of Search ................................... 324/319, 320, 324/318, 322, 307, 309, 300; 335/296, 297, 299

[56] References Cited

U.S. PATENT DOCUMENTS

| | | | |
|---|---|---|---|
| 4,350,955 | 9/1982 | Jackson et al. | 324/303 |
| 4,379,262 | 4/1983 | Young | 324/309 |
| 4,590,427 | 5/1986 | Fukushima et al. | 324/318 |
| 5,049,848 | 9/1991 | Pulyer | 335/296 |
| 5,117,188 | 5/1992 | Ohkawa | 324/318 |
| 5,331,282 | 7/1994 | McDougall et al. | 324/319 |
| 5,378,988 | 1/1995 | Pulyer | 324/318 |
| 5,402,094 | 3/1995 | Enge | 335/296 |
| 5,428,292 | 6/1995 | Dorri et al. | 324/319 |
| 5,572,132 | 11/1996 | Pulyer et al. | 324/318 |
| 5,677,630 | 10/1997 | Laskaris et al. | 324/319 |
| 5,744,960 | 4/1998 | Pulyer | 324/319 |

OTHER PUBLICATIONS

Journal of Magnetic Resonance, 41, pp. 400–405 (1980).
Journal of Magnetic Resonance, 41, pp. 406–410 (1980).

*Primary Examiner*—Louis Arana
*Attorney, Agent, or Firm*—George W. Neuner

[57] ABSTRACT

A magnet resonance imaging system is described having an open solenoidal magnet structure that provides a remote region of background field homogeneity for imaging that is open and accessible. The system includes spatial encoding gradient coils and a rf coil. The open magnet structure has a pair of primary solenoidal coils and a bias coil system located within the primary coil geometry. The primary and bias coils emit a total additive flux in an imaging region to generate a resulting background magnetic field profile that provides a remote region of substantial field homogeneity with open geometry for easy accessibility to a patient.

12 Claims, 23 Drawing Sheets

PLANAR OPEN SOLENOIDAL MAGNET MRI SYSTEM

FIELD OF THE INVENTION

This invention relates magnetic resonance imaging (MRI) systems, to magnet systems for producing a homogeneous imaging field for MRI and, particularly, to open solenoidal, preferably superconductive, magnet systems for providing a remote region of field homogeneity along with planar gradient coils for delivering gradient fields for spatial encoding in a remote target field region.

BACKGROUND OF THE INVENTION

There are known whole body MRI magnets (superconductive, resistive iron core magnets, and permanent magnets), which produce the background $B_o$ field used in MRI. The useable imaging volume in these magnets is in the region where the field homogeneity is a maximum. This volume is located in the air space centrally located between field sources. Thus, typically, MRI magnets are designed to provide a homogeneous magnetic field in an internal region within the magnet, e.g., in the air space of a large central bore of a solenoid or in the air gap between the magnetic pole plates of a C-type magnet. A patient or object to be imaged is positioned in the homogeneous field region located in such air space. In addition to the main or primary magnet that provides the background magnetic field $B_o$, the MRI system typically has gradient and rf coils, which are, used respectively for spatial encoding and exciting/detecting the nuclei for imaging. These gradient field and rf coils are typically located external to the patient inside the geometry of the $B_o$ magnet surrounding the central air space.

Prior art electromagnets such as described by Watson et al and Müller et al. and other prior art iron core magnets typically have a structural design to provide a maximum magnetic field strength at a large central air space. In addition, those types of the prior art magnets, of the iron core electro- or permanent type, have a substantial edge fringe field effect, which makes it difficult to image beginning immediately at the magnet edge or even proximal to the edge of the magnet due to lack of sufficient field homogeneity.

In U.S. Pat. No. 5,049,848 a magnet configuration for MRI mammography is disclosed. The magnetic structure 50 has a rectangular shaped magnet with at least two parallel magnetic source 5,6 connected by a ferromagnetic core flux path defining an air gap for imaging. A remote shimming C-shaped magnetic source is preferably used for shimming to decrease the front edge fringe effect of the magnetic structure 50 to create a relatively homogeneous field in the air gap beginning at the front edge for effective imaging.

Solenoidal MRI magnets (superconductive, resistive) as well as iron core C and E shape electromagnets or permanent magnets are known for imaging of the whole body and its extremities. However, such whole body MRI magnets are not generally well-suited for treatment of the patient with other modalities or for minimally invasive surgical procedures guided by real time MRI because of the limited access of the surgeon to the patient. This limited access results from the field producing means surrounding the imaging volume. Electromagnets of the C or E type iron core configuration have been designed to offer a partially open access to the patient, however, the access is still very limited with typical air gaps of only 40 cm between the pole pieces of a C type magnet. U.S. Pat. No. 5,378,988 describes a MRI system, which can provide access for a surgeon or other medical personnel, using a plurality of C-shape solenoidal magnets oriented to form an imaging volume in a central region of the magnets.

Another type of magnet specifically designed for interventional surgical guidance is General Electric's Magnetic Resonance Therapy device, which consists of two superconducting coils in a Helmholtz coil type arrangement. The air gap for this magnet is 58 cm, which typically permits access by one surgeon. None of those prior art magnets or MRI systems are not ideal with regard to simultaneously offering real time imaging and fully open access to the patient. Many surgical procedures require three or more surgeons together with an array of supporting equipment and, thus, a fully open magnet configuration for a MRI system for interventional procedures is desirable. In addition, such open magnet configuration is desirable for patients that have claustrophobia.

Applications other than MRI have used magnets that produce a useful field region outside the magnet geometry. U.S. Pat. No. 4,350,955 describes means for producing a cylindrically symmetric annular volume of a homogeneous magnetic field remote from the source of the field. Two equal field sources are arranged axially so that the axial components of the fields from the two sources are opposed, producing a region near and in the plane perpendicular to the axis and midway between the sources where the radial component of the field goes through a maximum. A region of relative homogeneity of the radial component of the background field $B_r$ may be found near the maximum. The large radial field is generally denoted as the $B_o$ background field in MRI applications. See also, *J. Mag. Resonance* 1980, 41:400–5; *J. Mag. Resonance* 1980, 41:406–10; *J. Mag. Resonance* 1980, 41:411–21. Thus, two coils producing magnetic dipole fields having opposing direction are positioned axially in a spaced relationship to produce a relatively homogeneous toroidal magnet field region in a plane between the magnets and perpendicular to the axis of cylindrical symmetry. This technology has been used to provide spectroscopic information for oil well logging but has not been used for imaging.

U.S. Pat. No. 5,572,132 describes a magnetic resonance imaging (MRI) probe having an external background magnetic field $B_o$. The probe has a primary magnet having a longitudinal axis and an external surface extending in the axial direction and a rf coil surrounding and proximal to the surface. The magnet provides a longitudinal axially directed field component $B_z$ having an external region of substantial homogeneity proximal to the surface. Comparing this magnet geometry to that of U.S. Pat. No. 4,350,955, it has a background $B_o$ field with a cylindrically symmetrical region of homogeneity. However, this magnet described in the copending application provides such a field in the axial or z direction (i.e., longitudinal axis direction) whereas the other provides a background $B_o$ field in the radial or r direction (i.e., radial direction). Preferably, the $B_o$ field is provided by two magnets spaced axially and in axial alignment in the same orientation and wherein said region of homogeneity intersects a plane that is located between the magnets and that is perpendicular to the axis. For MR imaging, surrounding the primary magnet are r-, z- and φ-gradient coils to provide spatial encoding fields.

It is desirable to have new and better devices and techniques for biomedical MRI applications such as open magnet MRI systems for imaging while performing surgery or other treatments on patients or for imaging patients that have claustrophobia. It is also desirable to have portable devices and imaging techniques that could be applied to a wide variety of imaging uses.

Copending U.S. Ser. No. 08/695,174 filed on Aug. 8, 1996 describes a planar MRI system having an open magnet configuration comprising two pairs of planar pole pieces that produces a magnetic field having a substantial remote region of homogeneity.

SUMMARY OF THE INVENTION

The present invention provides a solenoidal, planar MRI system having an open magnet configuration that produces a magnetic field having a substantial remote region of homogeneity. The MRI system includes spatial encoding gradient coils and a rf coil, each preferably having a planar configuration. The magnet configuration comprises a pair of primary solenoidal coils and, located within the primary coil geometry, a bias coil system, the coils emitting an additive flux in the imaging region to generate a resulting field which provides a remote region of substantial field homogeneity.

In one preferred embodiment, the primary coils are separated and a bias coil system is located between the primary coils. In another preferred embodiment, the primary coils are positioned adjacent each other and the bias coil system is located within the air space inside the primary coils. In a further preferred embodiment, portions of the two primary coils overlap and the bias coil system is located within the air space inside the primary coils.

In another embodiment of the invention, two planar magnet systems, e.g. the solenoidal open magnet configuration described herein, are positioned facing each other so that the target region of substantial field homogeneity is located between the two magnet systems. Enhanced fields of substantial homogeneity can be obtained for imaging larger objects.

Typically, the magnet geometry will be located on one side of a planar surface and the patient or body component to be imaged will be located on the opposite side of the planar surface, thereby providing a planar open magnet configuration. As described herein, the background field has a direction substantially parallel to the z-axis in a rectangular coordinate system, the y-axis and z-axis define the orientation of the planar surface, and the x-axis is perpendicular to the planar surface. The z-axis may sometimes be called the longitudinal axis.

As used herein, the term "remote" means that the field region is located external to the magnet geometry producing the field. As used herein, the terms "substantial homogeneity", "substantial field homogeneity" or "substantial relative field homogeneity" refer to and mean a region having field homogeneity sufficient for producing MRI images.

The distance of the region of homogeneity from the planar surface (or the outward facing ends of the primary solenoidal magnets) can be controlled by varying the ratio between the magnetomotive forces of the primary coils and the bias coil system. The primary coils are the major source for background field and determine the basic field strength. The bias coil system provides a biasing field, which contributes to the background field profile to provide the remote region of substantial homogeneity. The size, geometry, spacing and orientation angle of the coils with respect to the planar surface can influence the size of the homogeneous region.

Preferably, the side of the magnet system opposite the imaging target region is shunted by a planar ferromagnetic core back plate, which accommodates return flux and enhances magnet efficiency. The cross sectional area of the back plate can be made to have any predetermined value to keep the ferromagnetic material at any predetermined saturation point according to the value of mutual flux (and hence target field induction). Thus, magnet efficiency can be maintained at any number of ampere turns of the primary coils because these coils can couple with the back plate only by the return flux portion of the mutual flux.

The MRI system also preferably has (i) a planar xyz gradient coil system that produces a constant gradient field for spatial encoding in the region of homogeneity, i.e., the imaging volume or target region, as well as (ii) rf excitation and receiving coil (either integral or separate rf coils). Active shimming coils and/or passive ferromagnetic shimming components can be provided to increase the remote field homogeneity in a particular region.

The size of the magnet configuration and MRI system in accord with the present invention can be varied to provide whole body imaging or portable systems for localized imaging.

DETAILED DESCRIPTION OF THE INVENTION

Figure 1A:
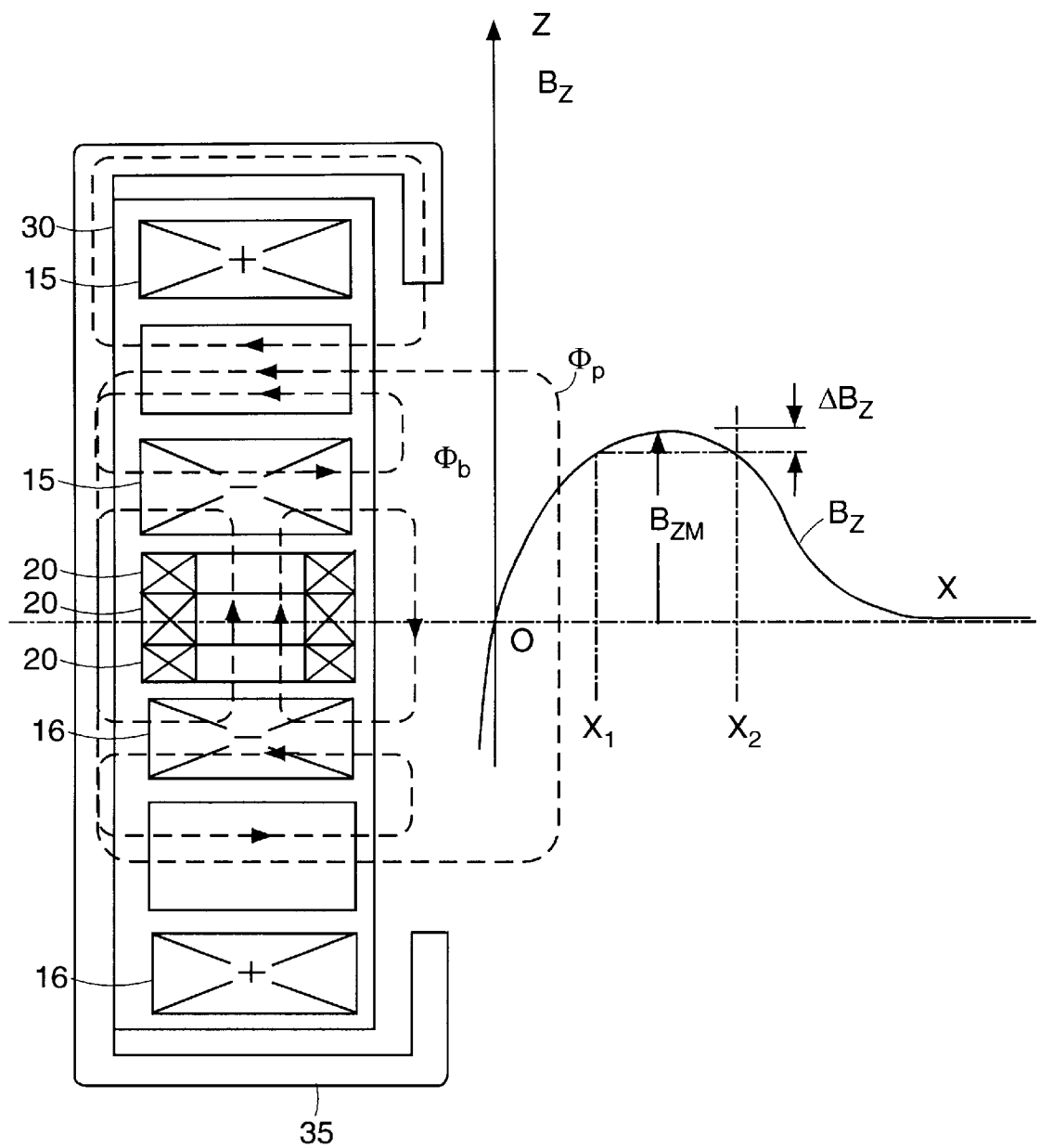
FIG. 1A is a side view schematic illustration of one embodiment of a solenoidal magnet configuration in accord with the present invention including a schematic illustration of the field lines emitted by the superposition of fields for the coils.

The invention will be described with reference to the drawings wherein like reference numerals in different figures refer to the same component. In accord with the present invention, a magnet configuration for a MRI system is an open device that provides a background $B_o$ field having a remote region of substantial homogeneity and oriented substantially parallel to the plane of the solenoidal coil ends (i.e., substantially perpendicular to the longitudinal center axis of the primary solenoid coils).

As illustrated in FIG. 1A, one embodiment of a magnet system 10 in accord with the present invention has two primary solenoidal coils 15,16 which provide a background $B_o$ field in a direction substantially perpendicular to the longitudinal center axis of the primary coils and having an open, easily accessible configuration. The primary coils are oriented with their longitudinal center axis substantially parallel to the x axis of the system as illustrated and provide the main background $B_o$ field as determined by the coils having turns $N_{p1}$, $N_{p2}$. A bias solenoidal coil 20 provides a bias field, opposing or co-directional with the main background field, as determined by the coil (consisting of three sub coil units as illustrated) having turns $N_{b1}$, $N_{b2}$, $N_{b3}$. The bias coil 20 is oriented with its longitudinal center axis parallel to the z axis of the system to provide flux $\phi_b$ opposing (as illustrated) the flux $\phi_p$ of the primary coils. Thus, the longitudinal axis of the bias coil 20 is substantially orthogonal to the axes of the primary coils and substantially parallel to a plane across the open end of the coil.

The $B_z$ field profile as a function of x for the composite field provided by the system 10 is illustrated by curve $B_z$ and has a remote region of substantial homogeneity between $x_1$ and $x_2$. As illustrated, the two fluxes interfere with each other and provide a resulting additive field. This illustration shows the field going through an extremum at a value of x remote from the magnet configuration and thus defines a region of substantial relative field homogeneity $\Delta B_z$ over a distance $\Delta x$, i.e., where the $B_z$ field component is substantially homogeneous for MRI imaging to be performed.

The axes of the primary coils can be positioned at an acute angle to the x axis to adjust the remote region of substantial homogeneity. The bias flux can also be provided to add to the flux of the primary coils. The strength and direction of the bias flux can be varied to adjust the remote region of substantial homogeneity. Additional active and passive shimming magnets can be provided for adjusting and enhancing the remote field region. Preferably the coils have a rectangular solenoidal shape. However, the shape can be varied to suit the particular application and provide mutual flux formation to enlarge a target field volume at a predetermined level of homogeneity.

Figure 2A:
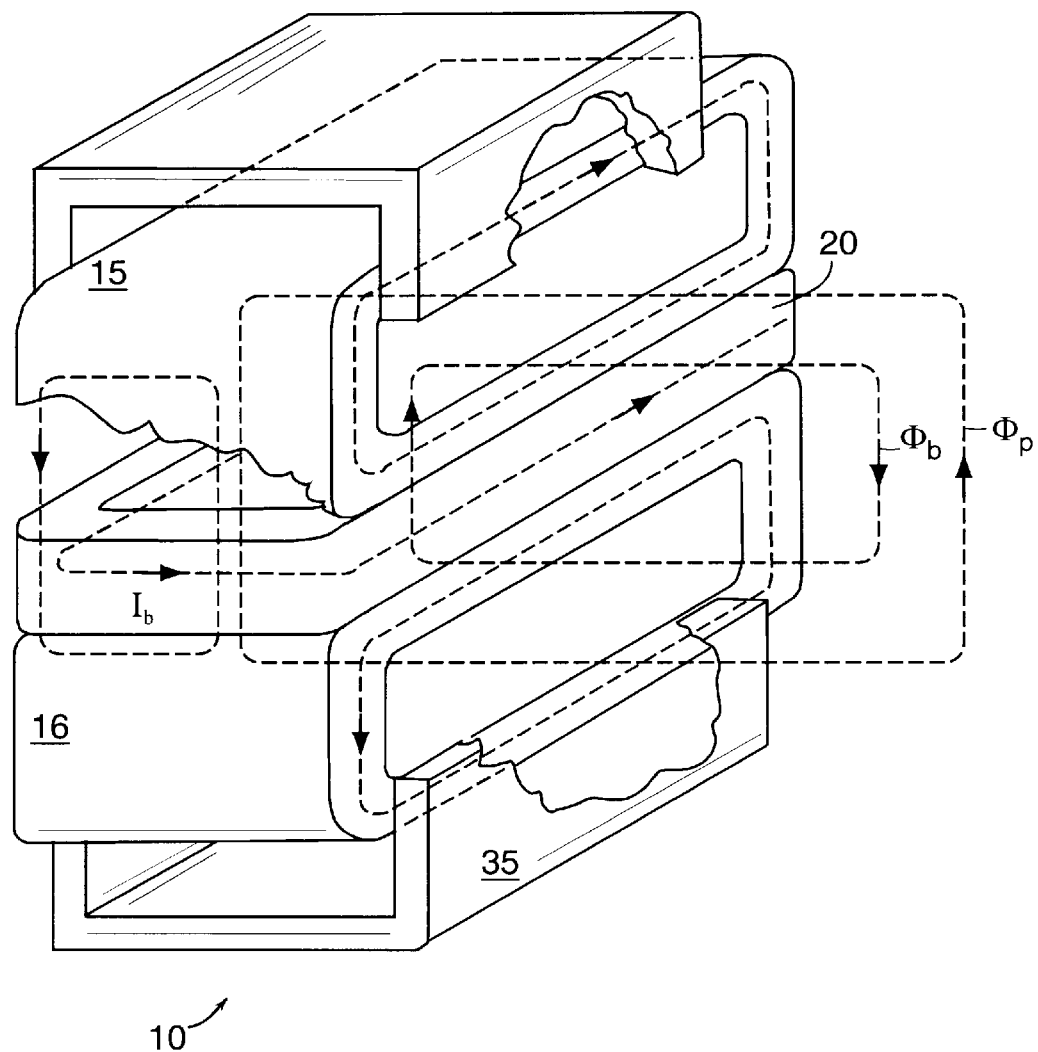
FIG. 2A is an isometric illustration of the magnet configuration of FIG. 1A.

A container 30 preferably surrounds the solenoidal coils. The container can be a superconductive container used as a cryostat when using superconductive coils for high field strength or can contain cooling elements in the case of resistive wire coils. In FIG. 2A, the container 30 is not shown. An external ferromagnetic container 35 preferably is provided for shielding and a return flux path.

Figure 2B:
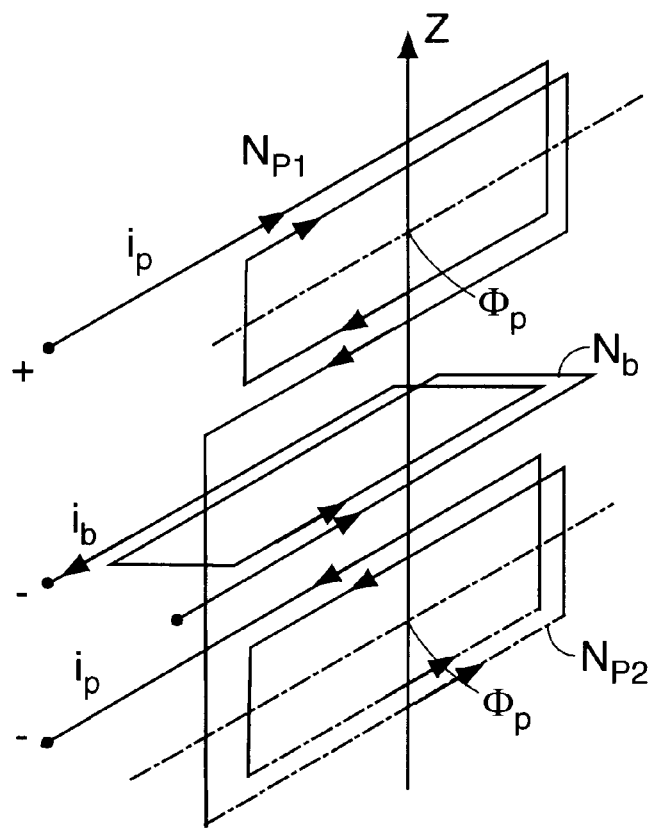
FIG. 2B is a 3-dimensional schematic showing a coil system illustration of the magnet configuration of FIG. 1A.
Figure 2C:
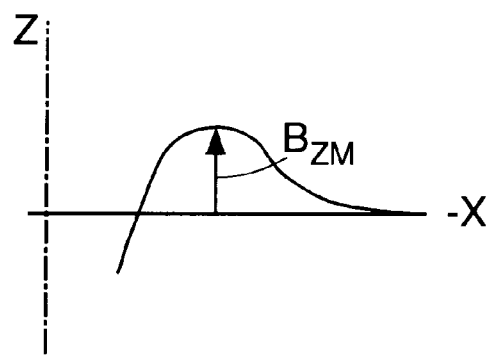
FIG. 2C is an illustration of the field profile in the x-direction provided by the magnet configuration of FIG. 1A.

FIG. 2B provides a schematic in 3-dimension of the coil winding geometry of the above magnet system to facilitate understanding of the relationship of the primary or basic excitation coils and the bias coil where "N" denotes the number of turns, "i" denotes the current, "φ" denotes flux, the subscript "b" denotes bias coil variables, and subscript "P" denotes primary coil variables.

Figure 4:
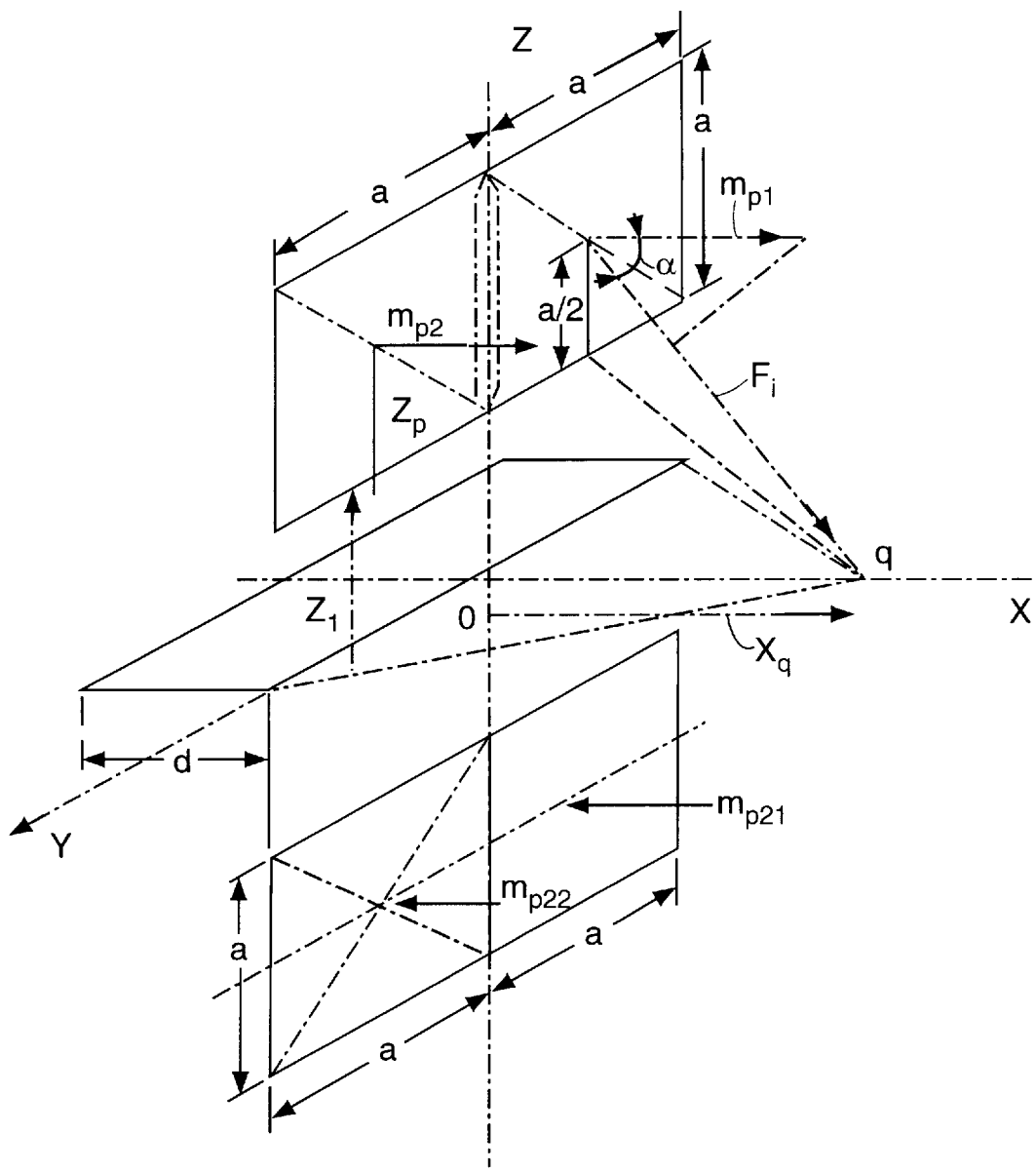
FIG. 4 is a 3-dimensional geometric analytical model for illustration of the remote region of homogeneity for the magnet configuration of FIG. 1A.

FIG. 4 is a schematic providing a 3-dimensional geometry analytical computational model that can be useful to determine the remote region of homogeneity provided by the magnet configuration of FIG. 1A. In this analytical model, the primary current contours and the bias current contours are equivalent to magnetic dipoles of a pole plate emitting flux, for which approximation it can be shown that a total superposed field is provided having one extremum maximum that determines the remote region of relative homogeneity. Varying the ratios of coil parameters and magnetomotive forces between the primary coils and the bias coils can optimize this region.

Figure 5:
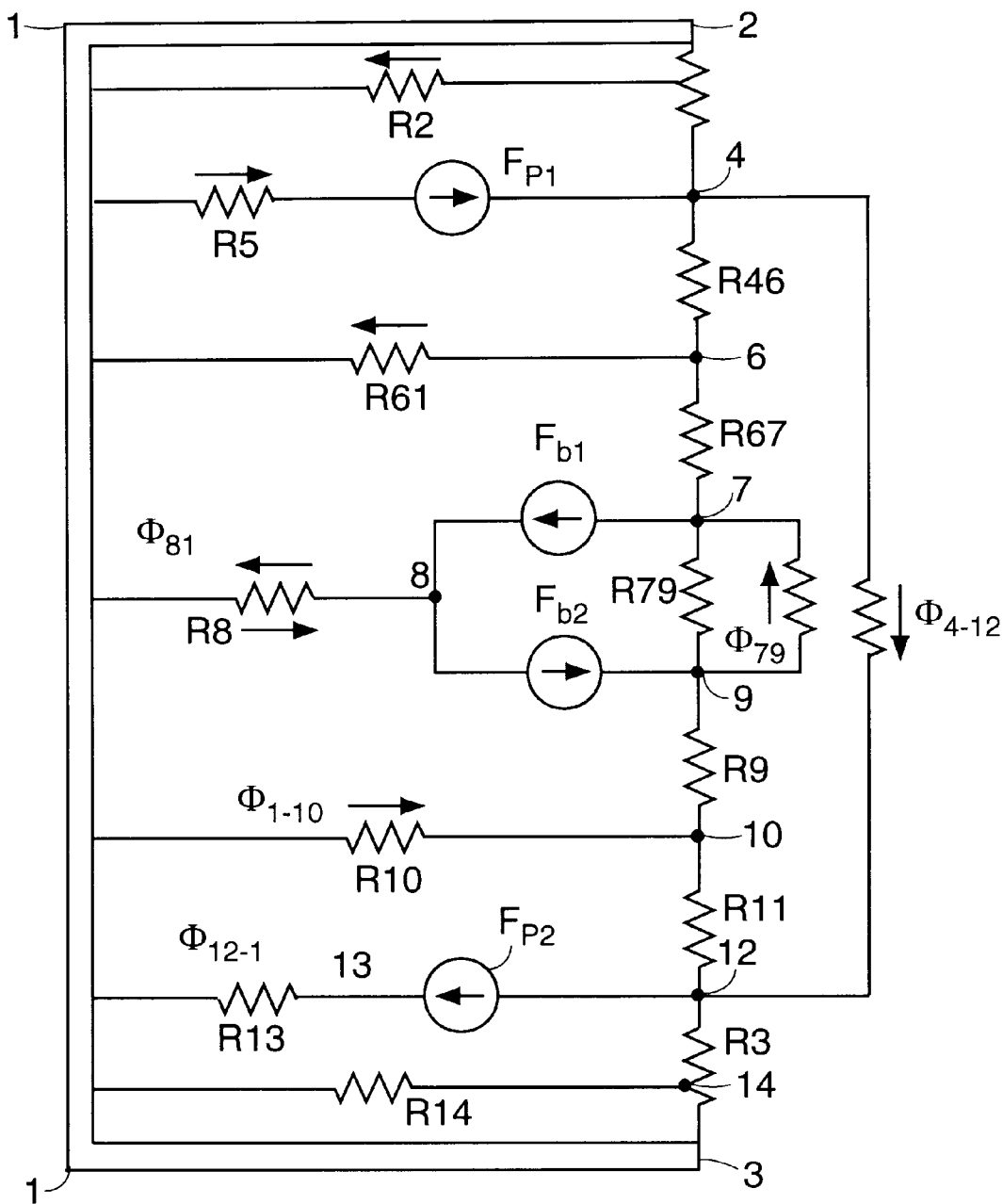
FIG. 5 is a schematic of an equivalent circuit (based on magnetic lumped parameters) of the magnet configuration illustrated in FIG. 1A.

To maximize magnet efficiency, the back plate ferromagnetic core material (for example, provided by container 35)

should be used in the linear range of the B(H) characteristic, reasonably close to the saturation region. An equivalent lumped parameter magnetic circuit for the general magnet coil coupling configuration of the present invention is provided in FIG. 5 to illustrate the basic relationship between the magnetomotive forces and fluxes and specifically to illustrate the back magnetic shunting and shielding effect provided by the external ferromagnetic container to enhance magnet efficiency, and also to provide better target field formation and to substantially minimize room magnetostatic expenditure. It can be used as an aid in computation of an electromagnet to determine core dimensions, coil parameters for desired field strength. This computation can be performed by techniques known to those skilled in the art by resolving the direct or reverse field problem to determine reluctances in the equivalent circuit. The ferromagnetic shunt is illustrated in the form of a C shaped shunt of zero reluctance, which consists of the components between points 1–2, 2–3 and 1–9. This equivalent circuit can be used as an aid to visualize the shunt effect of the ferromagnetic core back plate as well as the shield effect to the external flux leakage of the primary coils. It can also be used to compute magnet parameters and aid in optimizing such parameters.

The position of the region of homogeneity can be varied by the ratio and direction of the magnetomotive forces provided by the primary and bias coils.

Figure 3A:
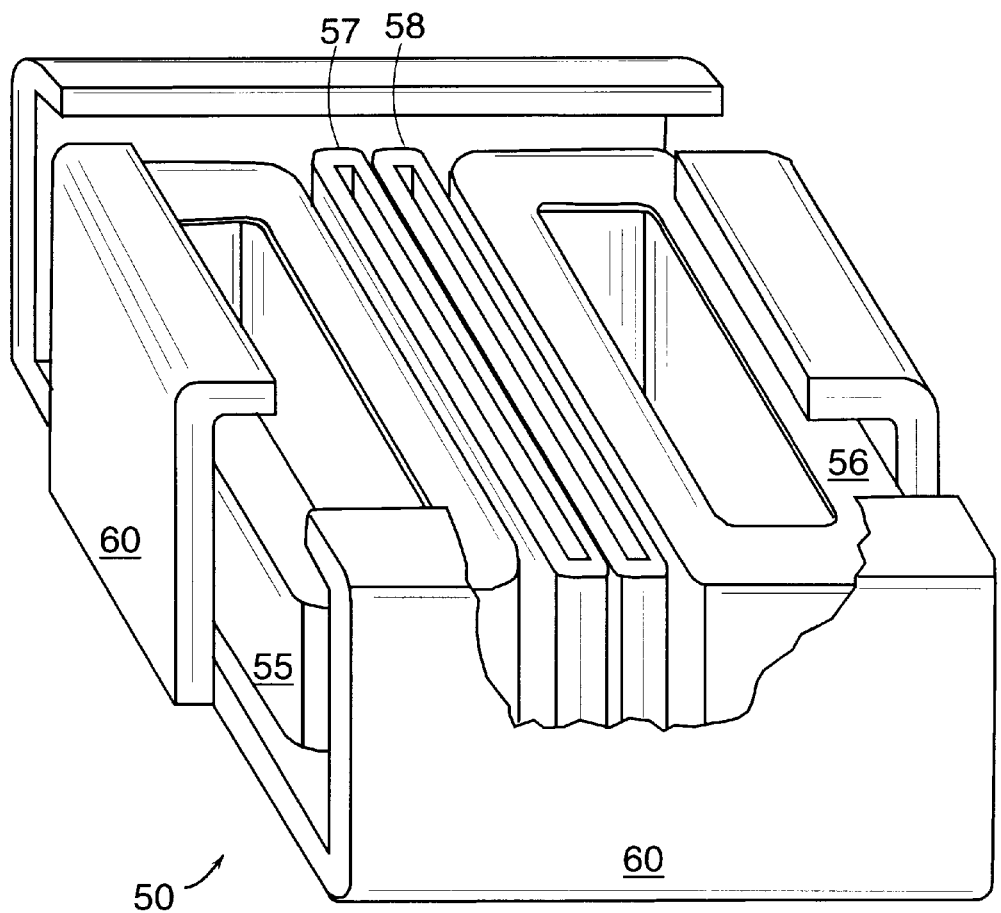
FIG. 3A is an isometric illustration of another embodiment of a solenoidal magnet configuration in accord with the present invention.
Figure 3B:
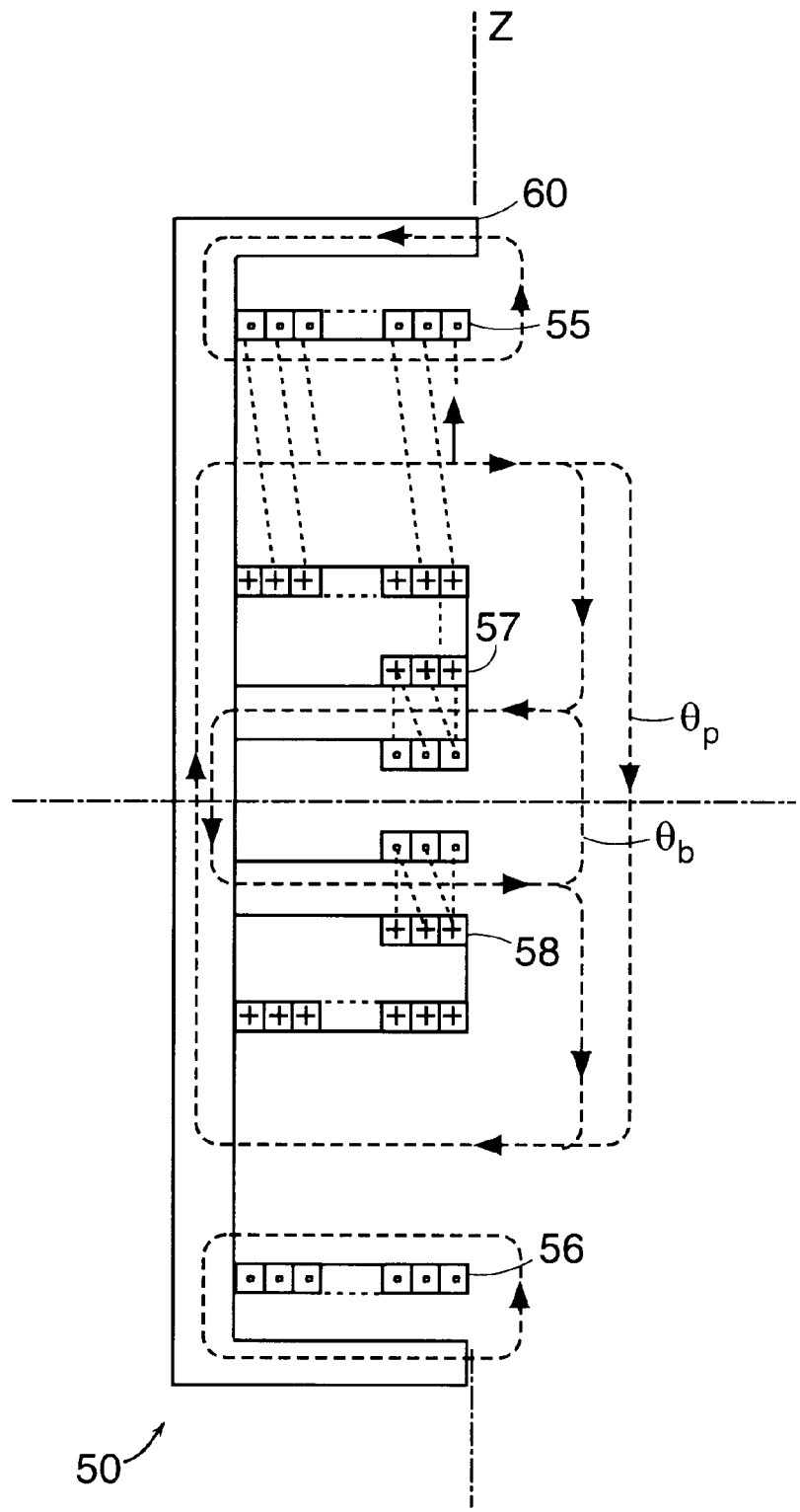
FIG. 3B is a front elevational view, partially in cross section of the magnet configuration of FIG. 3A further illustrating flux lines.
Figure 3C:
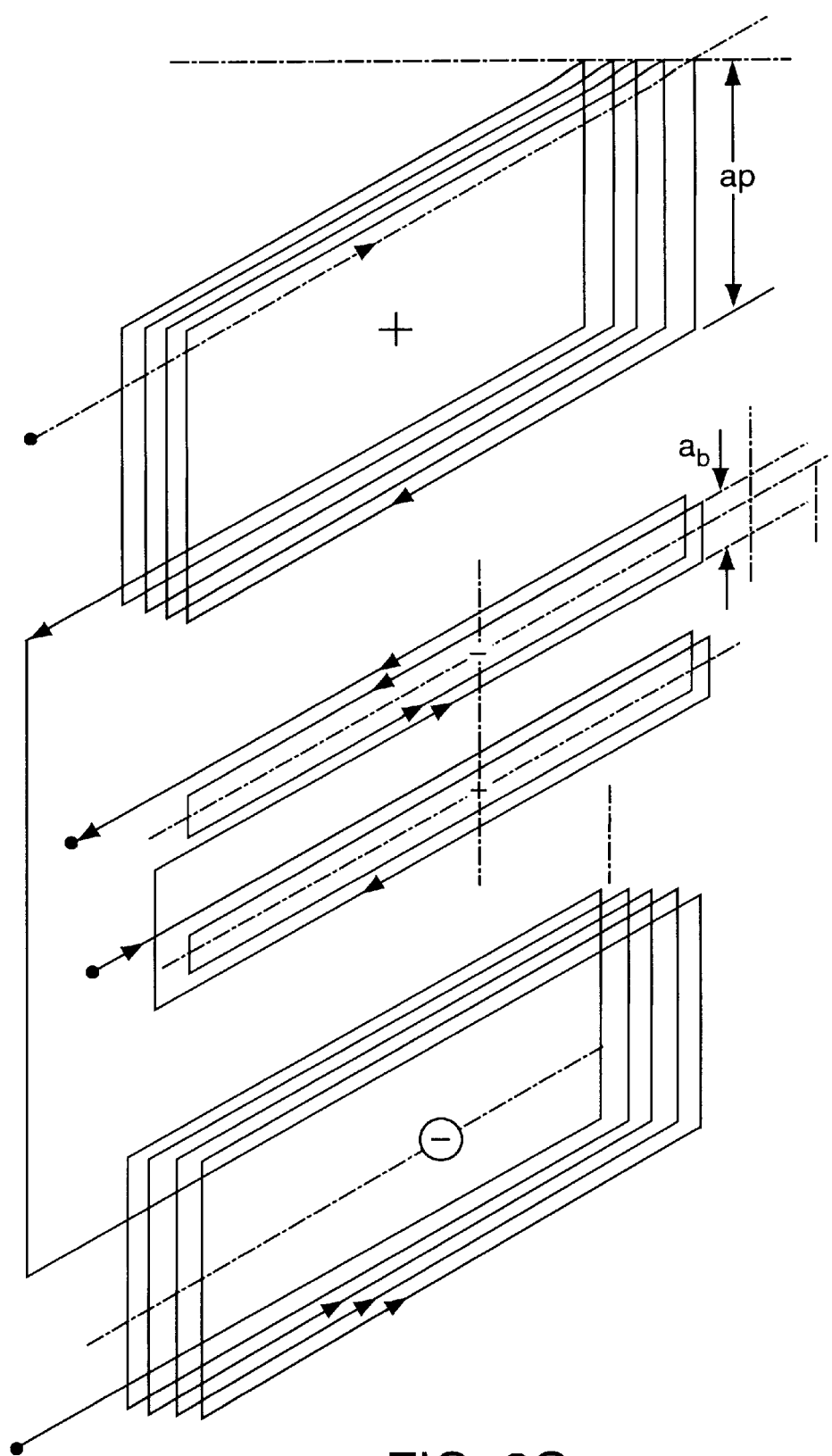
FIG. 3C is a 3-dimensional schematic coil system illustration of the magnet configuration of FIG. 3A.

An alternative embodiment of a magnet system 50 in accord with the present invention is illustrated in FIGS. 3A–3C. In this embodiment, two primary solenoidal coils 55,56 provide the main excitation coils and the flux illustrated by $\phi_p$ for the background field $B_o$. Two bias solenoidal coils 57,58 provide a bias flux illustrated by $\phi_b$. In this embodiment, the bias coils have axes substantially parallel to the primary coils. The superposition of the flux from the two sets of coils provides a remote region of substantial homogeneity similar to that provided by the configuration of FIG. 1A. The resulting field goes through an extremum at a value of x remote from the magnet configuration, similar to that illustrated in FIG. 1A. An external ferromagnetic container 60 preferably is provided for shielding and a return flux path. A container (not shown) preferably surrounds the solenoidal coils, which is a superconductive container when using superconductive coils for high field strength or contains cooling elements in the case of resistive wire coils.

FIG. 3C provides a schematic in 3-dimension of the coil winding geometry of the above magnet system to facilitate understanding of the relationship of the primary or basic excitation coils and the bias coil.

Figure 6B:
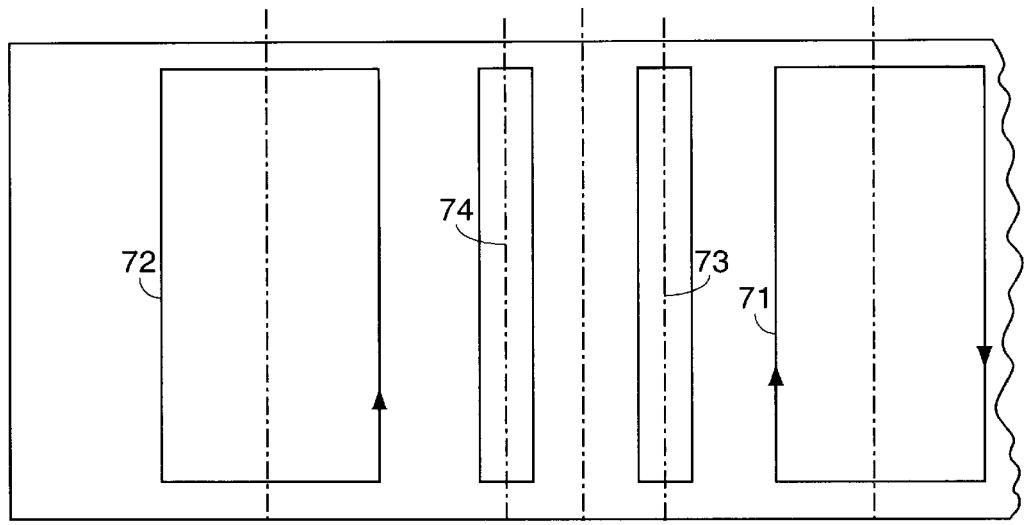
FIG. 6B is a plan view schematic illustration of the ceiling coil system of FIG. 6A.
Figure 6A:
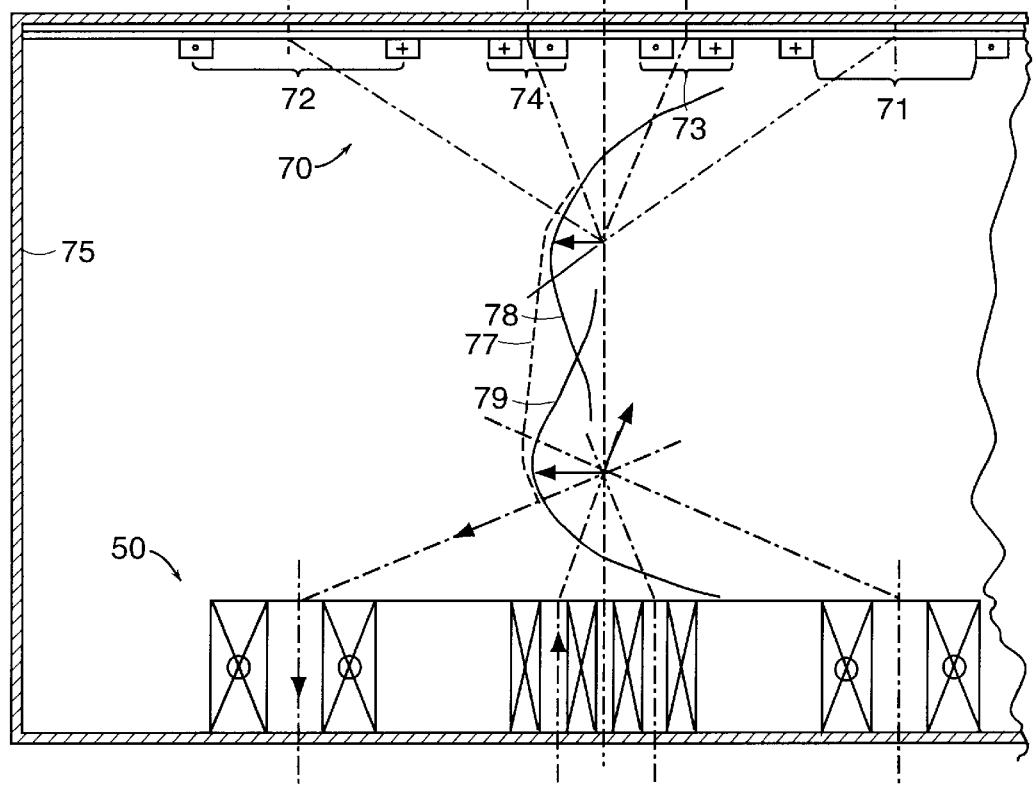
FIG. 6A is a side view schematic illustration of room shield shimming configuration showing a magnet configuration as illustrated in FIG. 3A and a ceiling coil system.

In another embodiment of the present invention, a system for shielding the ceiling in a room, in which the magnet systems of the present invention are used for MRI, is provided as illustrated in FIGS. 6A and 6B. A shielding and shimming coil system 70 is located at or in the ceiling of the room (se FIG. 6A). The ceiling shielding system uses two primary coils 71,72 and two bias coils 73,74 located between the primary coils, as illustrated in FIG. 6B. A magnet system 50 (which is the same system as illustrated in FIG. 3A) is located on the floor of the room. Ferromagnetic shielding material can be used in the floor and walls 75. The shielding coil system 70 in the ceiling provides a flux profile as illustrated by curve 78. The magnet system 50 provides a flux profile as illustrated by curve 79. The superposition of the fluxes or total field profile is illustrated by curve 77. As with the magnet systems of the present invention, the field profile of the ceiling shielding and shimming system 70 can be adjusted by varying the ratios of coil turns and current for the primary 71,72 and bias coils 73,74. Thus, the ceiling shielding system 70 can provide a shimming effect for the magnet system 50 and can be used to enhance or vary the remote region of substantial field homogeneity as illustrated by curve 77 (FIG. 6A).

Figure 1B:
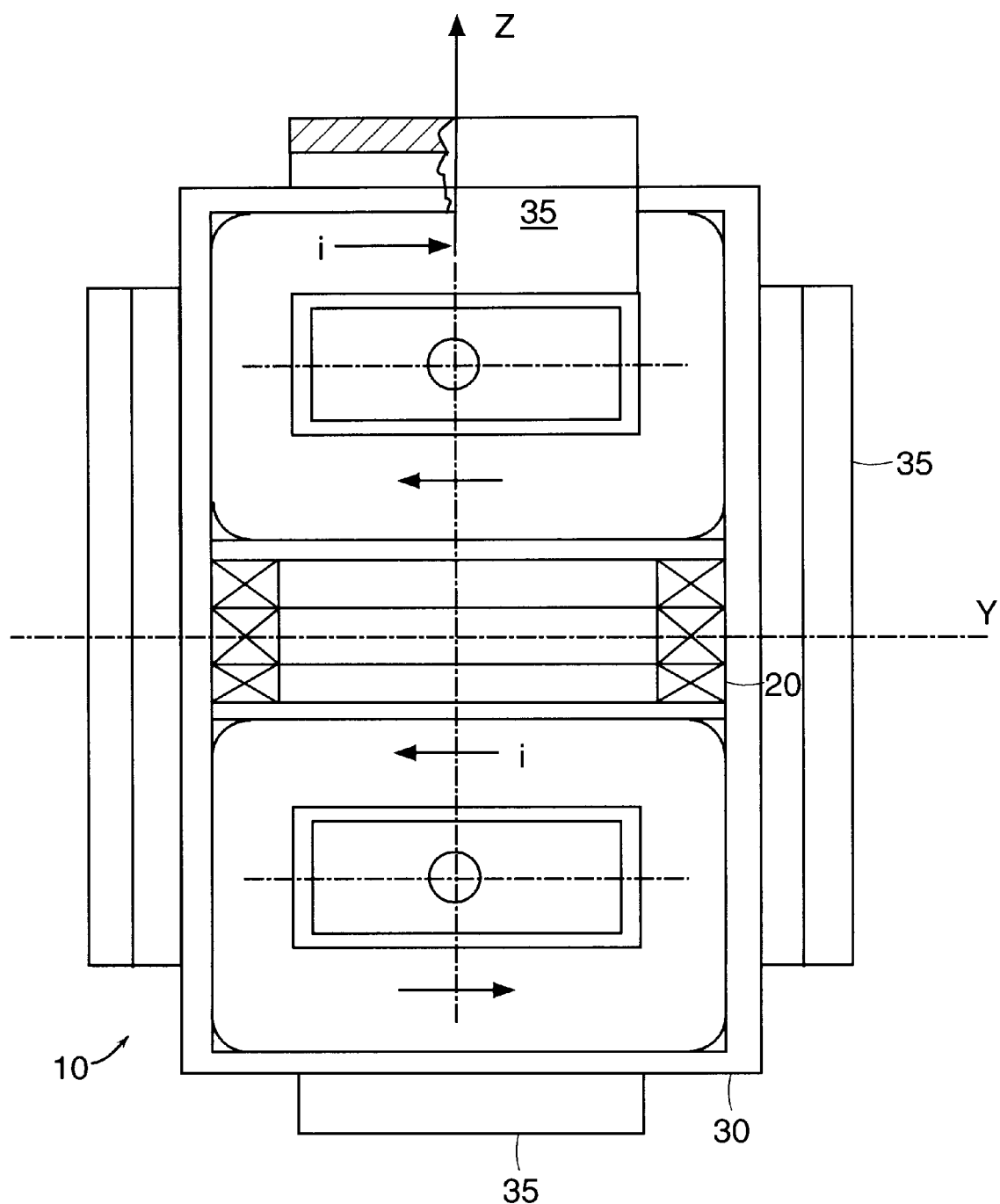
FIG. 1B is plan view of the magnet configuration of FIG. 1A.
Figure 7:
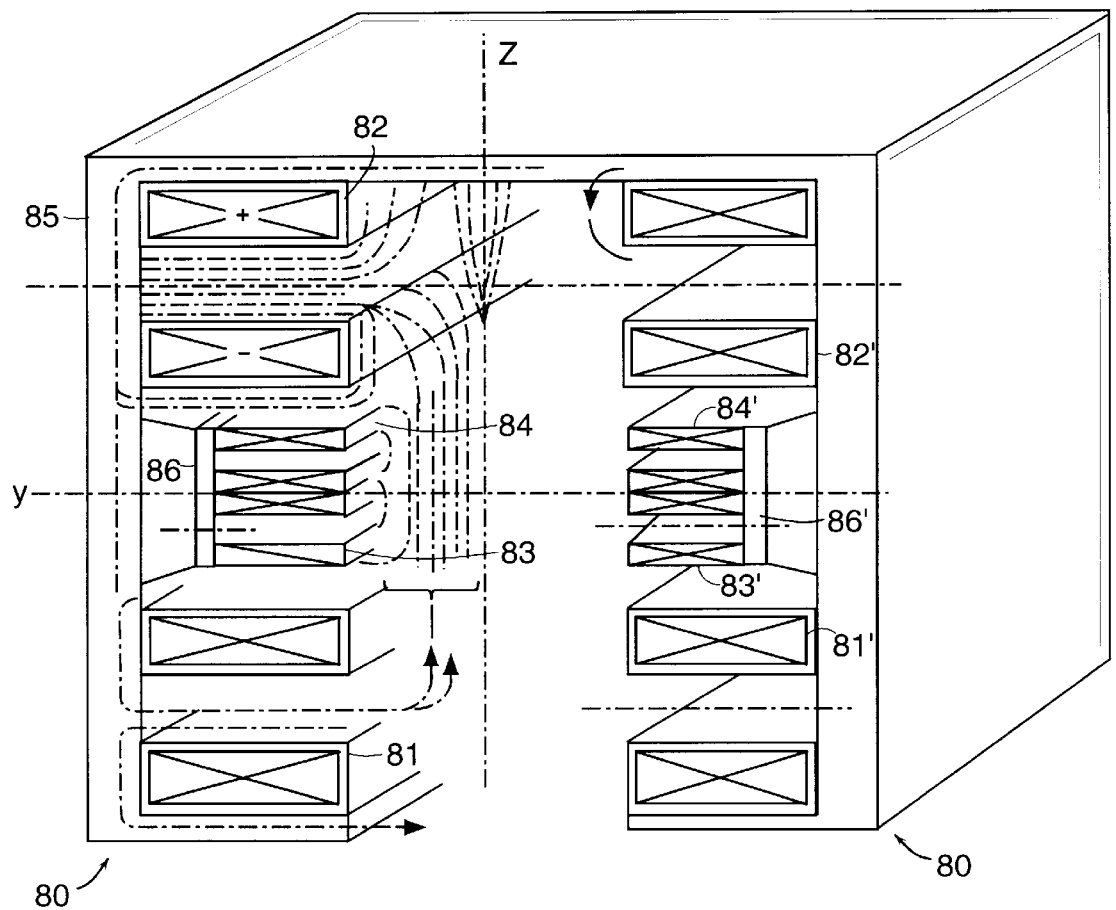
FIG. 7 is an isometric illustration of an embodiment, in accord with the present invention, of a solenoidal magnet system having two facing magnet configurations of the type illustrated in FIG. 3A.

In another embodiment of the invention, two magnet systems of the kind illustrated in FIG. 1A or FIG. 3A are positioned opposite each other as illustrated in FIG. 7. The two magnet systems 80,80' are positioned to provide the remote region of homogeneity between the two systems. Each system has primary coils 81,82 or 81',82' and bias coils 83,84 or 83',84'. A ferromagnetic core 85 is provided surrounding the external sides of the magnet systems 80,80' to shunt external flux. A bias shunt core of ferromagnetic material 86,86' is also used in this embodiment for each set of the bias coils. This duplex configuration can provide an enhanced region of substantial field homogeneity between the two magnet systems 80,80', approximately doubling the field strength of a single such system. A container for the solenoidal coils for cooling, etc. is preferably used (similar to container 30, as illustrated in FIGS. 1A–1B. Resistive iron core electromagnets can also be used to provide a similar magnet configuration.

Additional alternative embodiments of solenoidal magnet configurations having a set of primary coils and a set of bias coils to provide a remote region of substantial field homogeneity are illustrated in FIGS. 8A, 8B, 9A, 9B, 10A, 10B, 11A and 11B. In these embodiments, the solenoidal bias coils are located within the air space of the primary solenoidal coils.

Figures 8A, 8B:
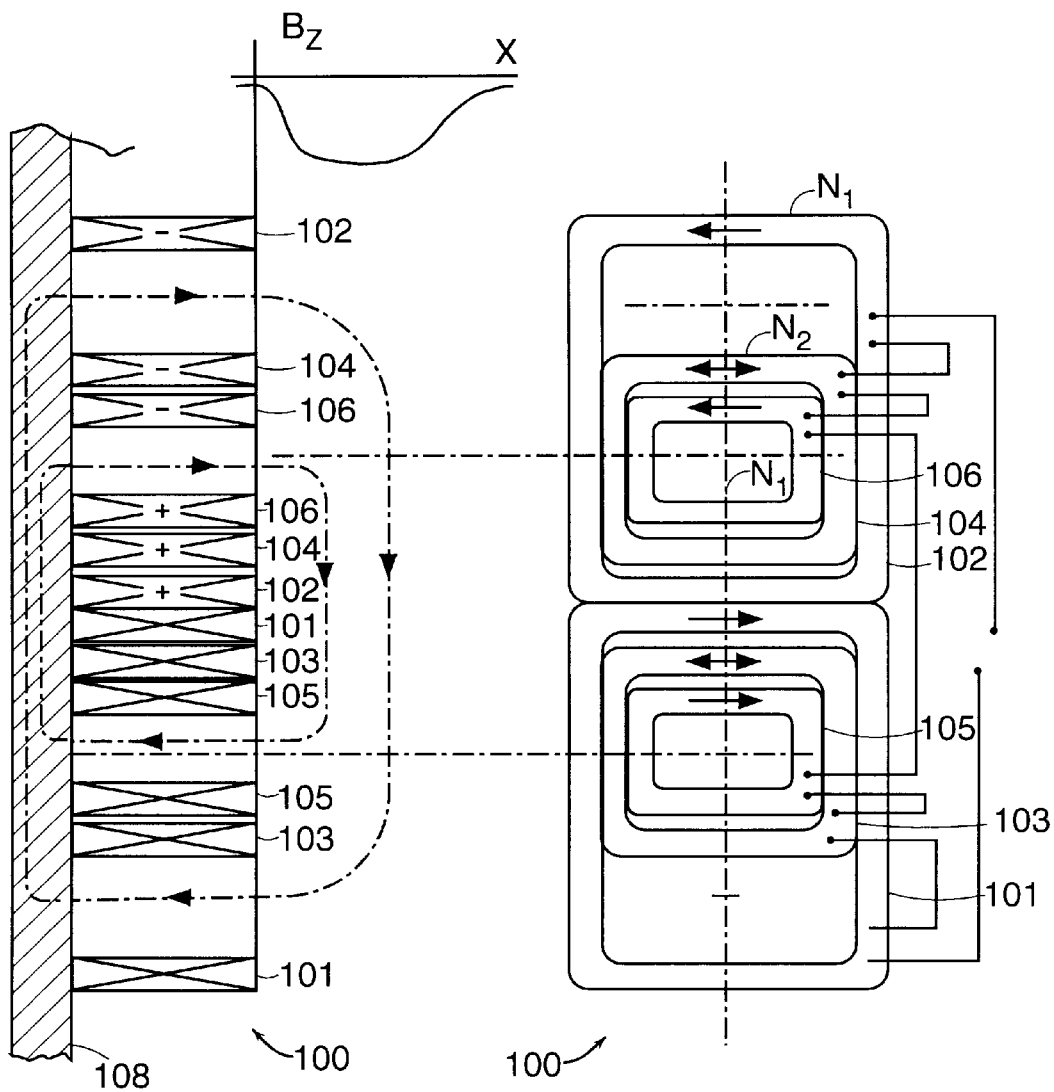
FIG. 8A is a plan view of an alternative embodiment of a solenoidal magnet configuration in accord with the present invention.
FIG. 8B is a side view of the solenoidal magnet configuration of FIG. 8A.

FIGS. 8A–8B illustrate a solenoidal magnet system 100 having primary solenoidal coils 101,102. Within the air space of the primary coils are located two sets of bias solenoidal coils 103,104 and 105,106. Bias coils 103,104 have a current in the opposite direction of the current in the primary coils 101,102 to provide a flux opposing the flux of the primary coils. Within the first set of bias coils 103,104 are located a second set of bias coils 105,106. The second set of bias coils has current in the same direction as the current in the primary coils to provide flux having the same polarity as the flux of the primary coils. The primary coils are positioned next to each other and the bias coils are positioned as close to the center of the two primary coils as the structural geometry permits. A ferromagnetic core shunt plate 108 is provided on the side of the magnets opposite the target region to provide enhanced magnet efficiency.

Figure 9B:
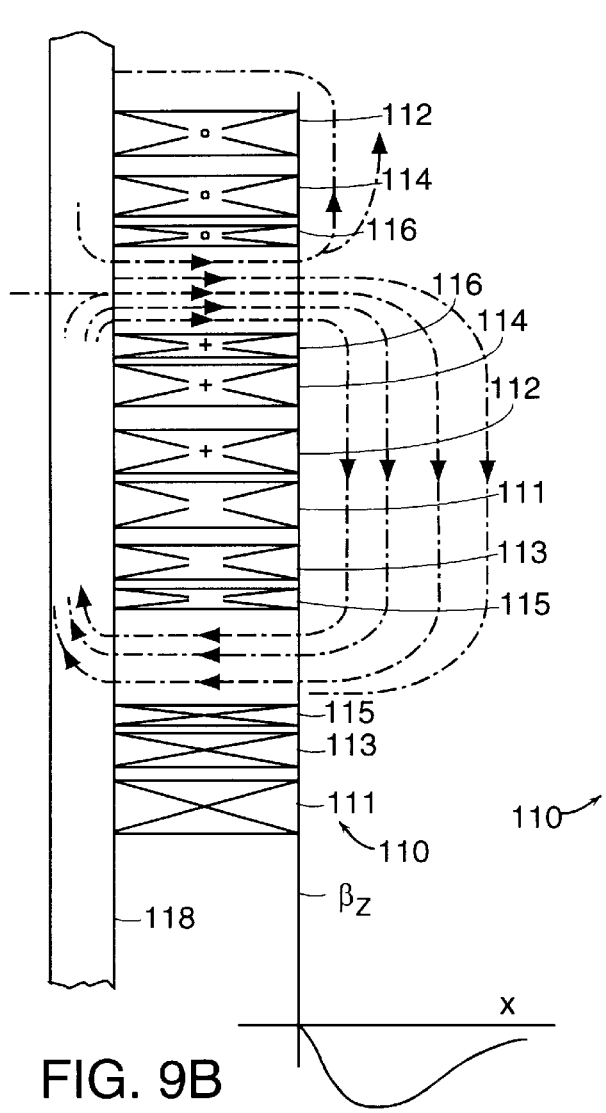
FIG. 9B is a side cross sectional view of the solenoidal magnet configuration of FIG. 9A.
Figure 9A:
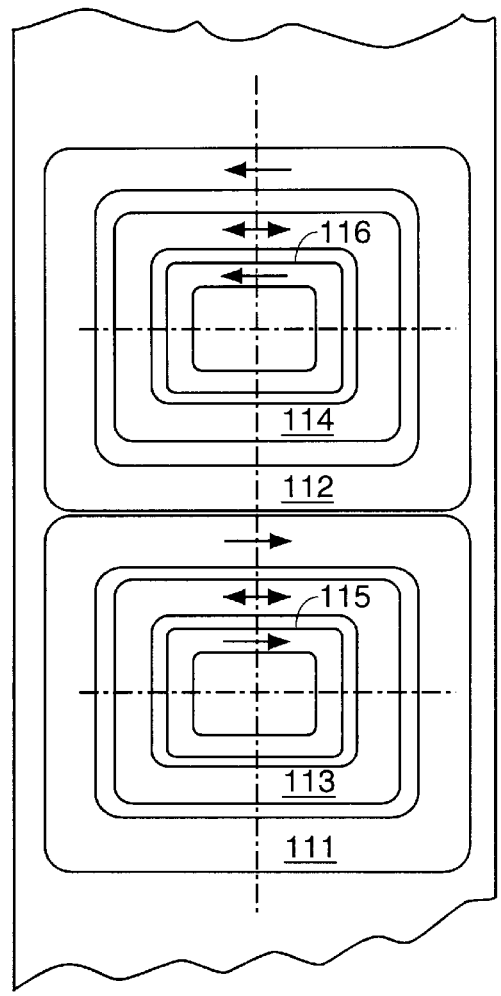
FIG. 9A is a plan view of a further alternative embodiment of a solenoidal magnet configuration in accord with the present invention.

FIGS. 9A–9B illustrate a solenoidal magnet system 110 having primary solenoidal coils 111,112. Within the air space of the primary coils are located two sets of bias solenoidal coils 113,114 and 115,116. Bias coils 113,114 have a current in the opposite direction of the current in the primary coils 111,112 to provide a flux opposing the flux of the primary coils. Within the first set of bias coils 113,114 are located a second set of bias coils 115,116. The second set of bias coils has current in the same direction as the current in the primary coils to provide flux having the same polarity as the flux of the primary coils. The primary coils are positioned next to each other and the bias coils each are positioned in the center of the air space of the primary coils. A ferromagnetic core shunt plate 118 is provided on the side of the magnets opposite the target region to provide enhanced magnet efficiency.

Figure 10A:
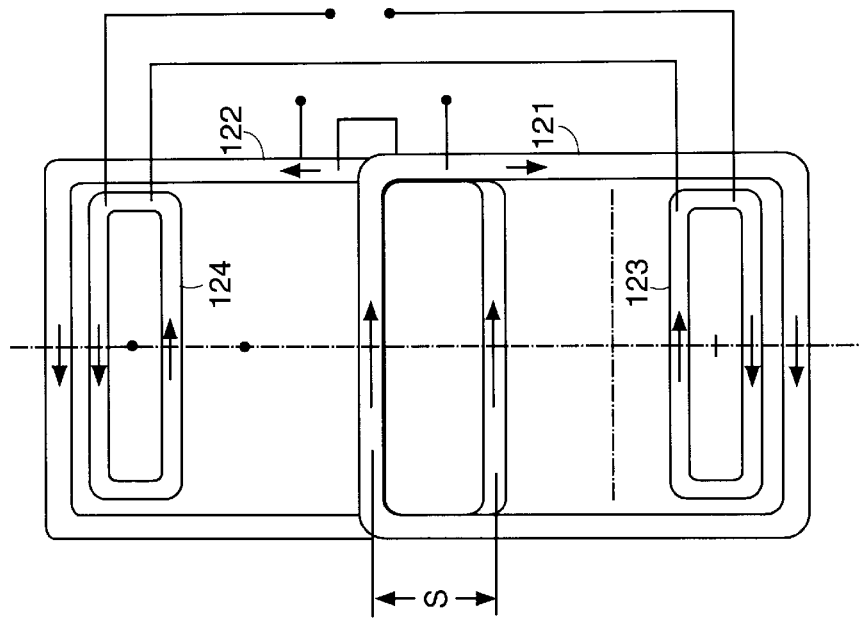
FIG. 10A is a plan view of another alternative embodiment of a solenoidal magnet configuration in accord with the present invention.
Figure 10B:
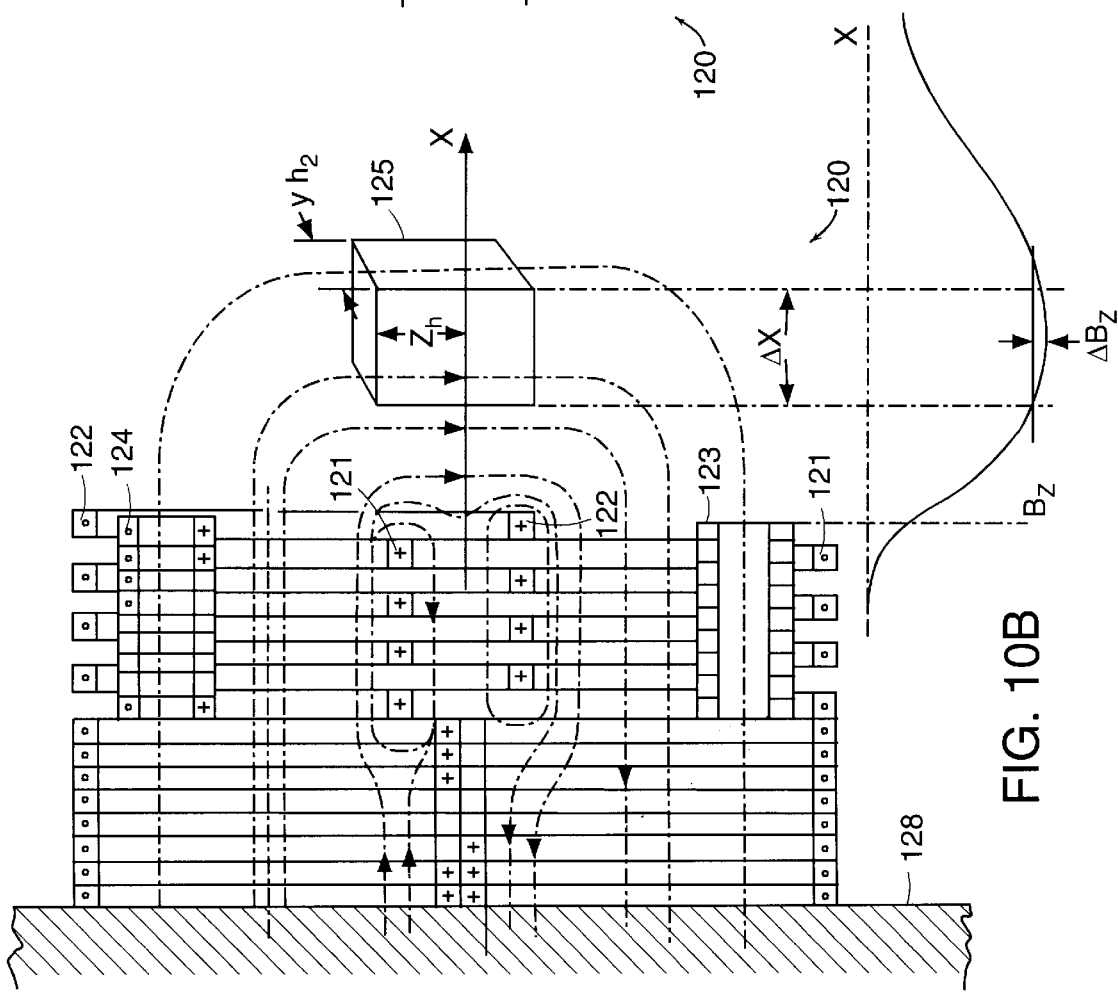
FIG. 10B is a side cross sectional view of the solenoidal magnet configuration of FIG. 10A.

FIGS. 10A–10B illustrate a solenoidal magnet system 120 having primary solenoidal coils 121,122, a portion of the turns of which overlap. Within the air space of the primary coils are located bias solenoidal coils 123,124. Bias coils 123,124 have a current in the opposite direction of the current in the primary coils 121,122 to provide a flux opposing the flux of the primary coils. The bias coils each are positioned in the air space of the primary coils, each bias coil being located as far from the other bias coil as structural geometry permits. A ferromagnetic core shunt plate 128 is provided on the side of the magnets opposite the the target region to provide enhanced magnet efficiency. This configuration provides a target region for imaging 125 having a field profile $B_z$ curve as illustrated with the region of substantial homogeneity identified as $\Delta B_z$.

Figures 11A, 11B:
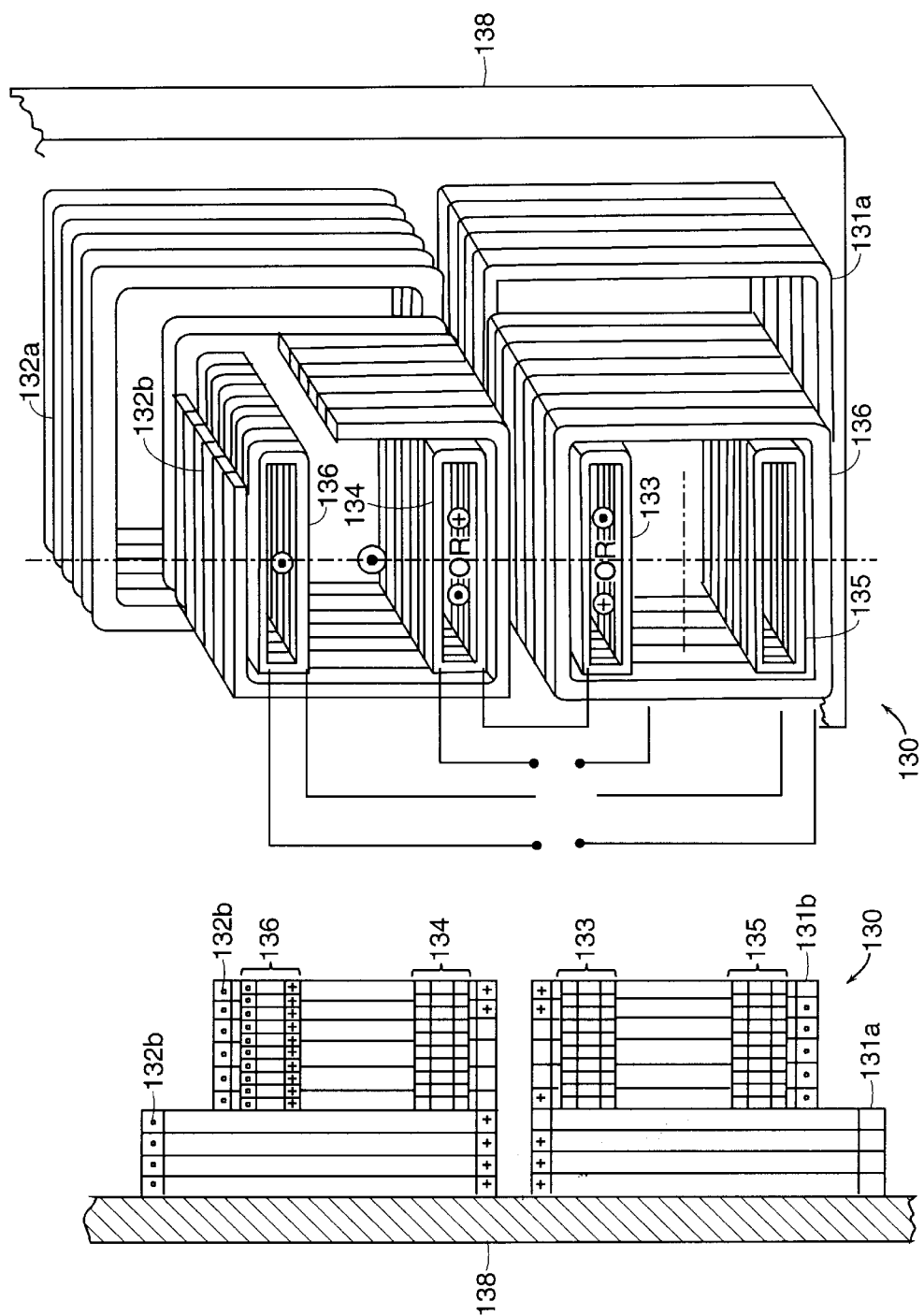
FIG. 11A is an isometric view of still another alternative embodiment of a solenoidal magnet configuration in accord with the present invention.
FIG. 11B is a side cross sectional view of the solenoidal magnet configuration of FIG. 11A.

FIGS. 11A–11B illustrate a solenoidal magnet system 130 having primary solenoidal coils 131,132, each primary coil being constructed in two portions, i.e., a base portion 131a,132a having a larger cross-sectional area and a top portion 131b,132b having a smaller cross-sectional area. The side of each portion of the primary coils is adjacent to the other coil. Within the air space of the top portions 131b,132b of the primary coils are located two sets of bias solenoidal coils 133,134 and 135,136. The first set of bias coils 133,134 have a current in a predetermined direction to provide a flux adding to or opposing the flux of the primary coils, as desired. The first set of bias coils 133,134 are positioned in the air space of the primary coils, each bias coil being located as close to the center line between the primary coils as structural geometry permits. The second set of bias coils 135,136 have a current in the opposite direction of the current in the primary coils to provide a flux opposing the flux of the primary coils. The second set of bias coils 135,136 are positioned in the air space of the primary coils, each bias coil being located as far from the center line between the primary coils as structural geometry permits. A ferromagnetic core shunt plate 138 is provided on the side of the magnets opposite the target region to provide enhanced magnet efficiency.

In accord with the present invention, a MRI system comprising a magnet configuration, for example, as illustrated in FIG. 1A also comprises a set of xyz gradient coils to provide spatial encoding in the remote region of background $B_o$ field homogeneity for imaging. In keeping with the planar open design of the magnet geometry and configuration of the present invention, planar xyz gradient coils were created. Advantageously, the remote field xyz gradient coils are preferably planar open surface coils. Preferably, the entire gradient coil is substantially in the same plane. In accord with the present invention, each current plane coil does not have a complimentary or mirror image current plane in order to generate the desired gradient field between the complimentary planes. Thus, in accord with the present invention, each single planar gradient coil produces a remote gradient field along the x, y or z axis in the target region of background field homogeneity.

Figure 12:
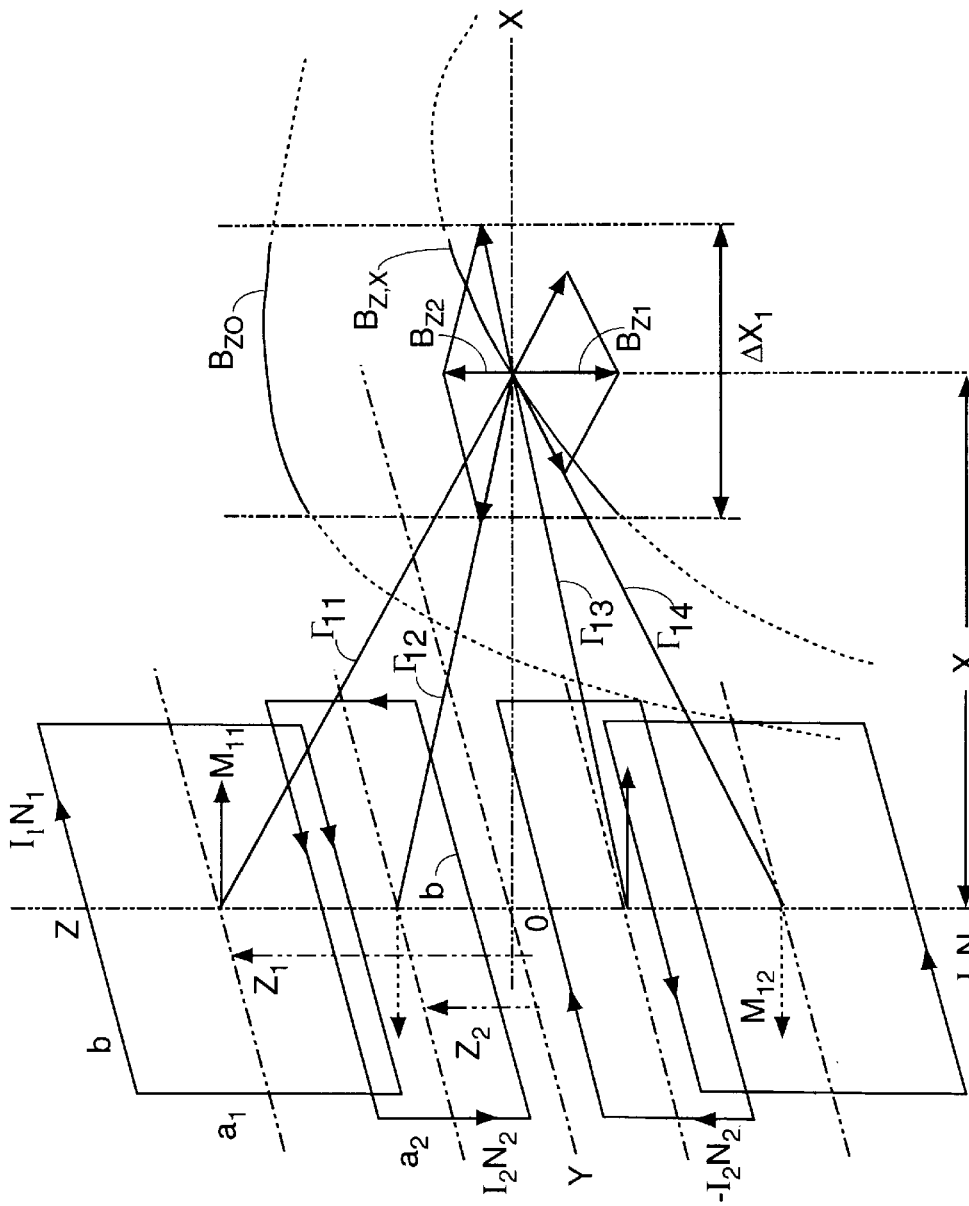
FIG. 12 is a schematic illustrating a planar remote field x-gradient coil in the form of an array of current loops and further illustrating at the center of each loop the vector magnetic dipole associated with the loop. Also illustrated are the field vectors generated by the magnet dipoles, which shows an approximately constant gradient field.

In accord with this invention, as illustrated in FIG. 12, a planar remote field x-gradient coil can be constructed using multiple current loops in a current loop array configuration. As shown, two external loop sections are configured to have mutually opposite current polarity. Two internal current loop sections are configured also to have mutually opposite current polarity and the current polarity in the inner loop sections is also mutually opposite its corresponding external loop section (FIG. 12A). The array loops are symmetric with respect to the y and z axes.

Also illustrated on the right side of FIG. 12 is a simple field computation approximation using the magnetic moment vectors associated with the current loops. The basic $B_z$ field components at $x_1$ contributed by each of the four magnetic dipoles are shown. The vector sum of the field from the two main current loops with current $I_1$ and turns $N_1$ is denoted $B_{z1}$ and the two bias current loops with current $I_2$ and turns $N_2$ is denoted $B_{z2}$. Also illustrated on right hand side of FIG. 12 are (i) the vector sum of the field from the current loops which produces a gradient field $B_{z,x}$, which is substantially linear over the target field region $\Delta x_1$ and which corresponds to the region in which the background field $B_{z,o}$, (also shown) goes through an extremum.

Figure 13A:
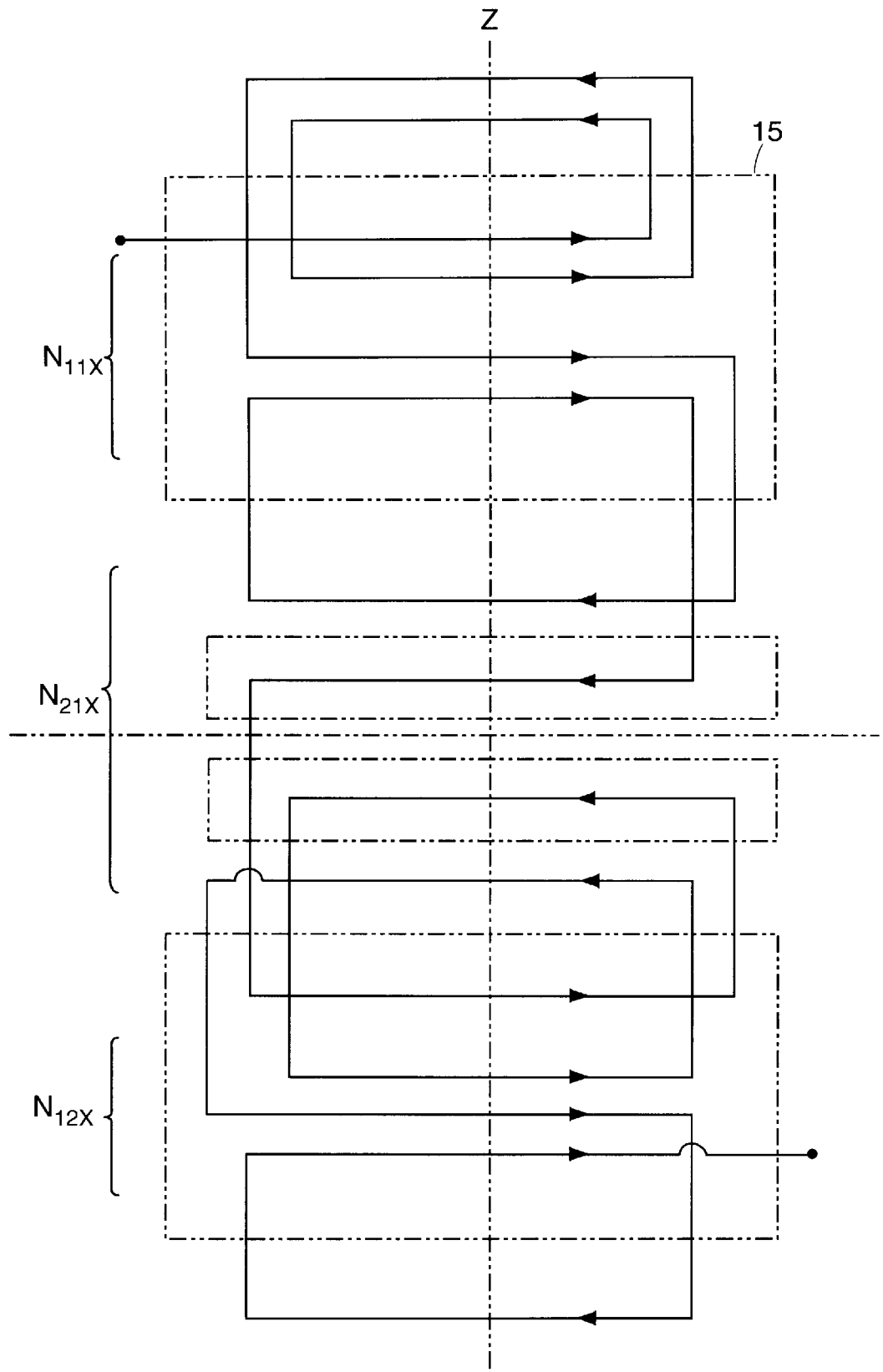
FIG. 13A is a schematic plan view illustration of a planar remote field x-gradient coil in the form of an array of current wires.
Figure 13B:
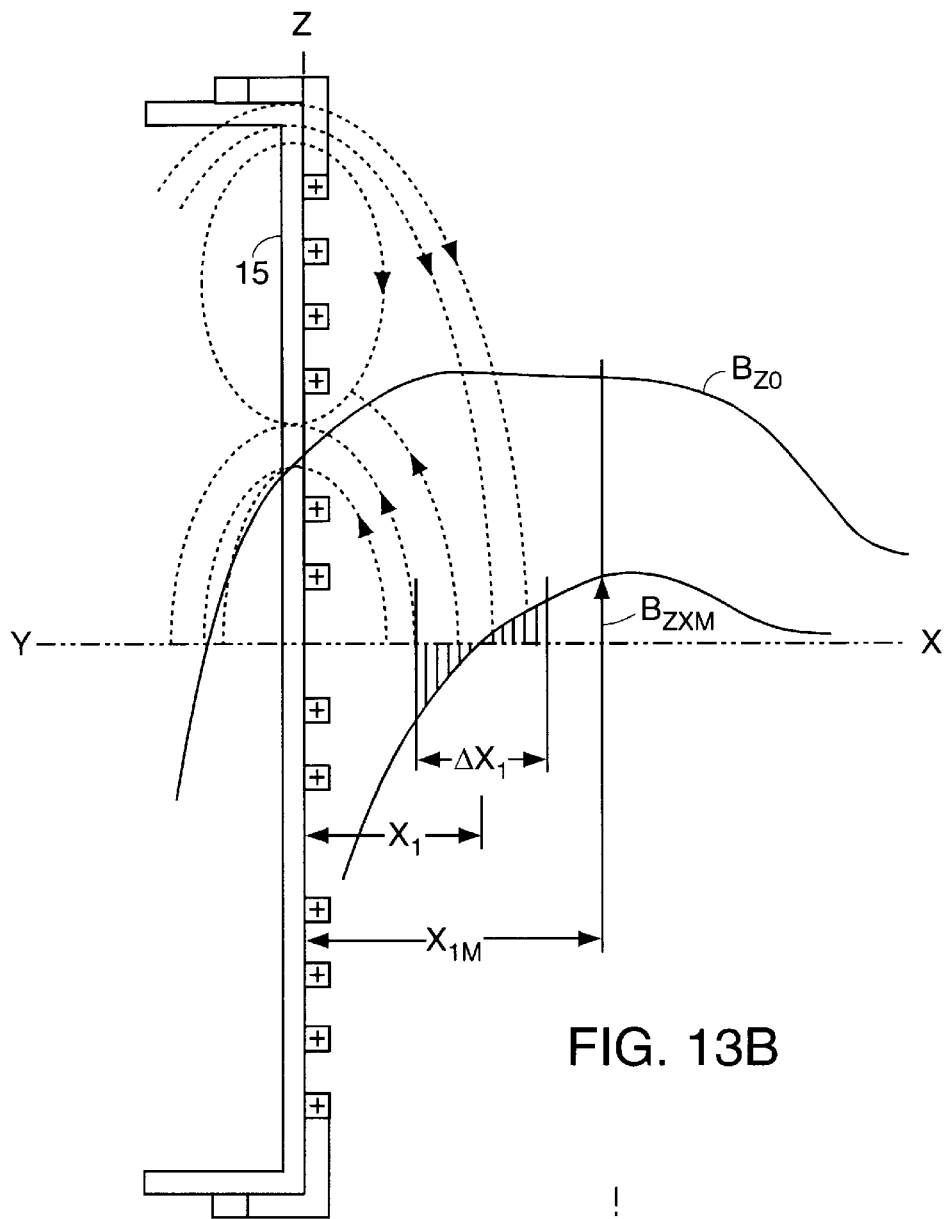
FIG. 13B is a cross sectional view of the x-gradient coil of FIG. 3A along the z-axis illustrating field lines and further schematically illustrating the $B_z$ field as a function of x at y=z=0 showing an approximately constant gradient field with respect to x.
Figure 13C:
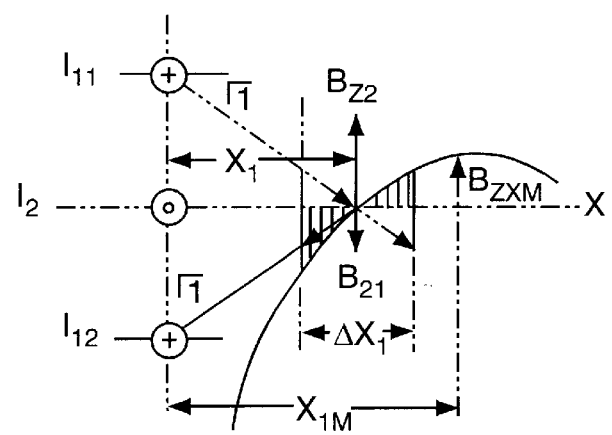
FIG. 13C illustrates a simple three current wire array and a simple computation vector diagram for this current wire array.

An alternative x-gradient coil structure is illustrated in FIG. 13A, with field lines of the two opposing fluxes illustrated in FIG. 13B with the resultant x-gradient field, z component, $B_{z,x}$ which is substantially linear over $\Delta x_1$ illustrated in the right side of FIG. 13B. This coil structure is a current wire array and will provide a remote linear x-gradient field similar to the current loop array depicted in FIG. 12. FIG. 13C illustrates a simple three wire system for demonstration purposes.

The x-gradient coil structure has ampere wire distribution on a planar surface 215 with two external unidirectional current wire sections $N_{11x}$ and $N_{12x}$ with a central unidirectional current section $N_{21x}$ having opposite current polarity to provide a central bias field, thereby providing a remote z-component field having substantially constant gradient as illustrated in FIG. 13B.

It should be noted that the x-gradient coil geometry is similar in concept to the magnet geometry for the $B_o$ background field.

Figure 14A:
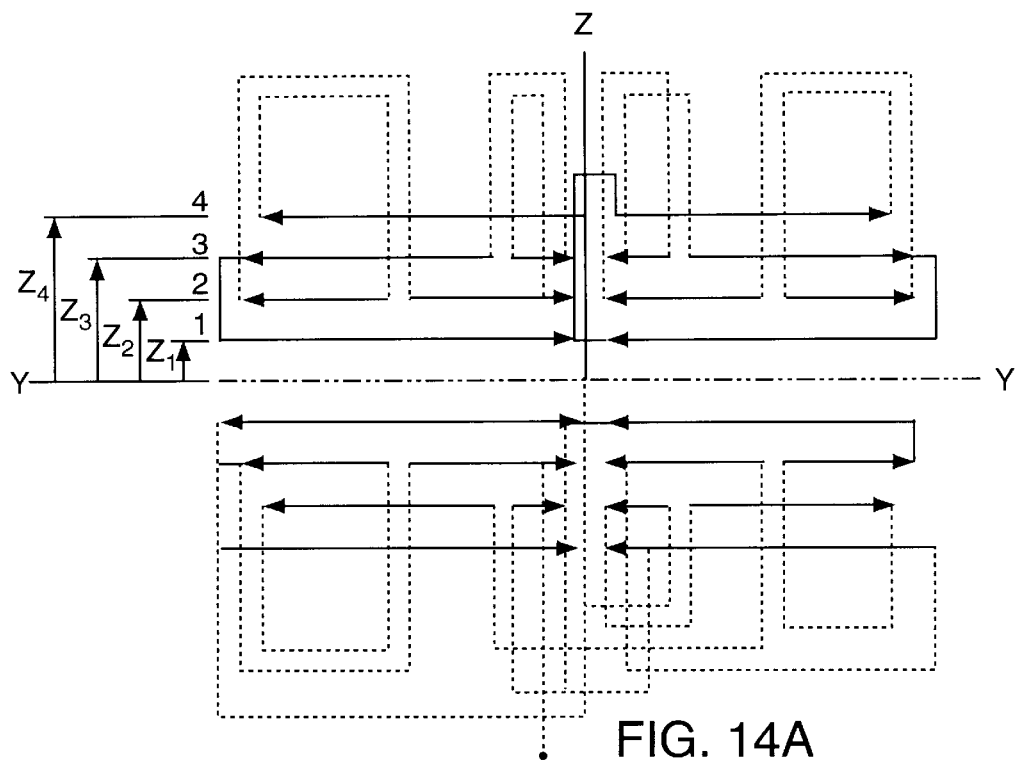
FIG. 14A is a schematic plan view illustration of a planar remote field y-gradient coil in the form of a current wire array.

In accord with this invention, as illustrated in FIG. 14A, a planar remote field y-gradient coil can be constructed using a current wire array. As illustrated, the current wire array preferably has four sections corresponding to four y,z quadrants: first having coordinates 0, −y, z; the second having coordinates −0, y, z; the third having coordinates 0, −y, −z; and the fourth having coordinates 0, y, −z; in other words, the quadrant boundaries are the y and z axes in the x=0 plane. Each quadrant section is divided in subsections along the y axis. The subsections at each z-level ($z_1$, $z_2$, $z_3$ . . . ) are symmetrical about and have opposing current polarity with respect to the z-axis. The subsections are also symmetrical about and have the same current polarity with respect to the y-axis. As can be seen from FIG. 14B, the number of current wires remains constant over y at each level of z, however, the number of wires having positive and negative current polarity varies along y. The current wires providing the remote y-gradient field are connected by return wires (dashed in FIG. 14A) which are located far enough away from the desired wire current array to minimize target field disturbance.

Figure 14B:
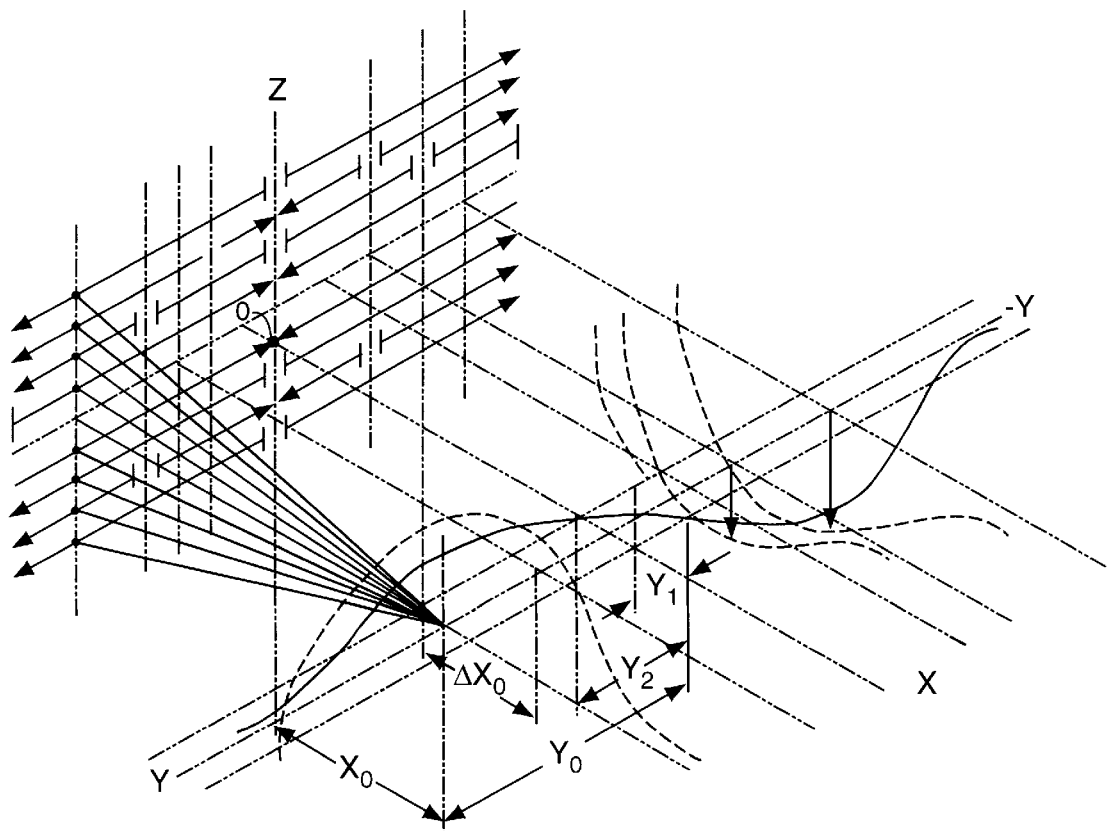
FIG. 14B is an isometric illustration of the planar array of FIG. 4A. including an illustration of the remote y-gradient field provided by the array of FIG. 4A.

FIG. 14B illustrates the current wire array, which is located in the x=0 plane, extends in the y direction from +$y_o$ to −$y_o$, and provides a y-gradient field in a remote region. It illustrates only the operative current wires of the array of the wiring schematic of FIG. 14A. The y-gradient field is a field directed in the same direction z as the background field $B_o$ and which varies linearly with y. On the right side of FIG. 14B is an illustration of the y-gradient field at the remote plane x=$x_o$. Note that the field is sinusoidal as a function of y so that the region of linearity is localized around y=0. The region of linearity can be specified as a fraction of $y_o$ which is approximately 0.5 $y_o$. Thus, increasing the spatial extent of the current wire array in y can increase the region of linearity in y.

The gradient field depends upon y because the distribution of current wires with positive and negative currents parallel to the y axis changes with the y position. FIG. 14B illustrates the current pattern changes at y=$y_1$, $y_2$, etc. Thus, between $y_o$ and $y_1$, the current pattern as a function of z is constant and then changes to a different pattern between $y_1$ and $y_2$. The field produced by each of these current patterns is shown as a function of x at each incremental y position where the z pattern of the current wire array changes. In each case, the field goes through an extremum at the same value of x, in this case $x_o$, however, the amplitude of the extremum changes from positive to negative producing the gradient field.

Figure 14C:
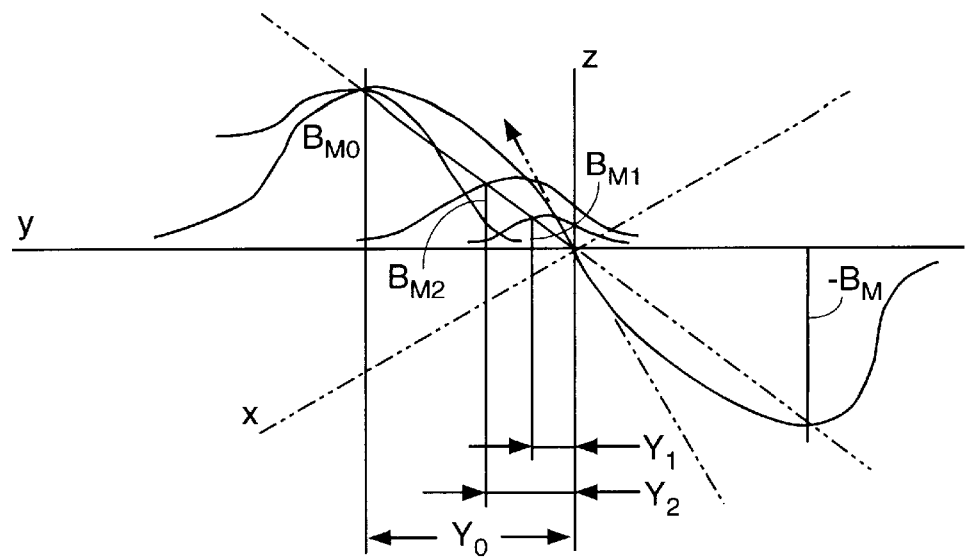
FIG. 14C is an illustration of the y-gradient field profile along the y-axis of FIG. 4B.

FIG. 14C is an illustration of the gradient field profile. Because the field is an extremum at the remote $x=x_o$ plane, it is a region of relative homogeneity. The region of homogeneity of the gradient field extends in the x direction over a distance $\Delta x_o$.

Figure 14D:
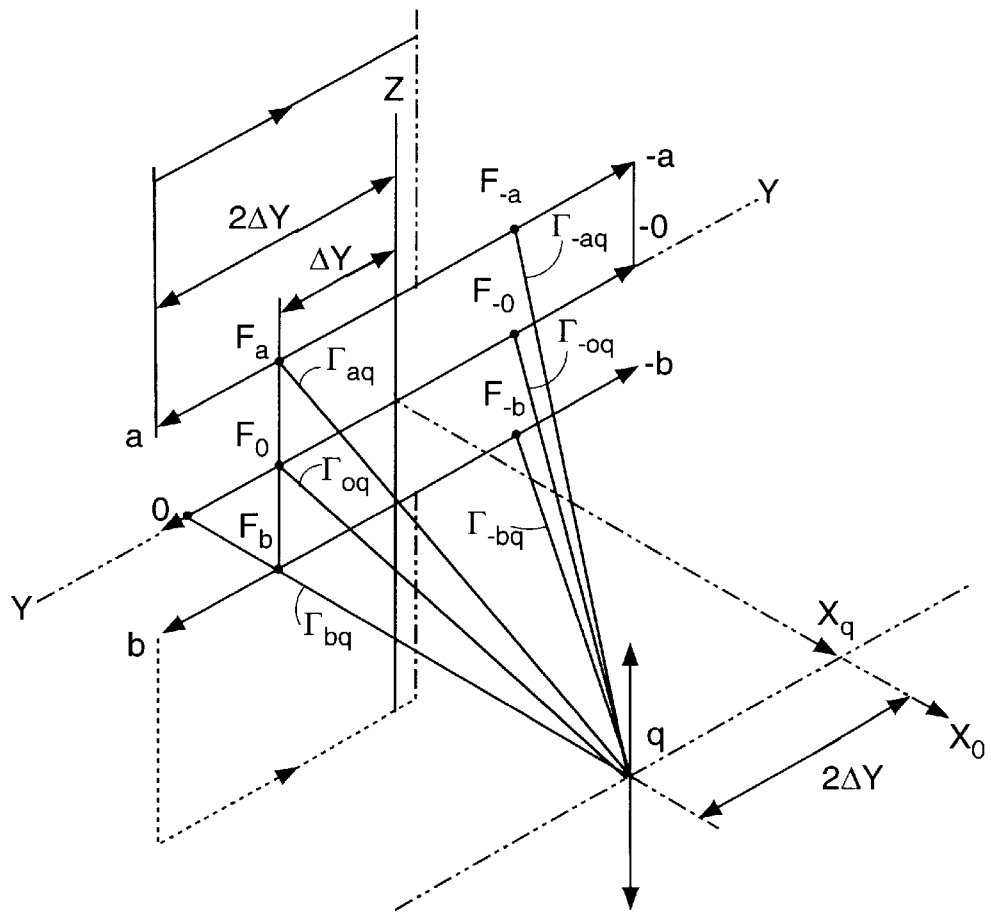
FIG. 14D is an illustration showing a simple six (6) wire array for a y-gradient coil for analysis of coil capability.

FIG. 14D illustrates the simplest six current wire array, which is useful as an analytical model for easy computation of the remote y-gradient field.

Figure 15A:
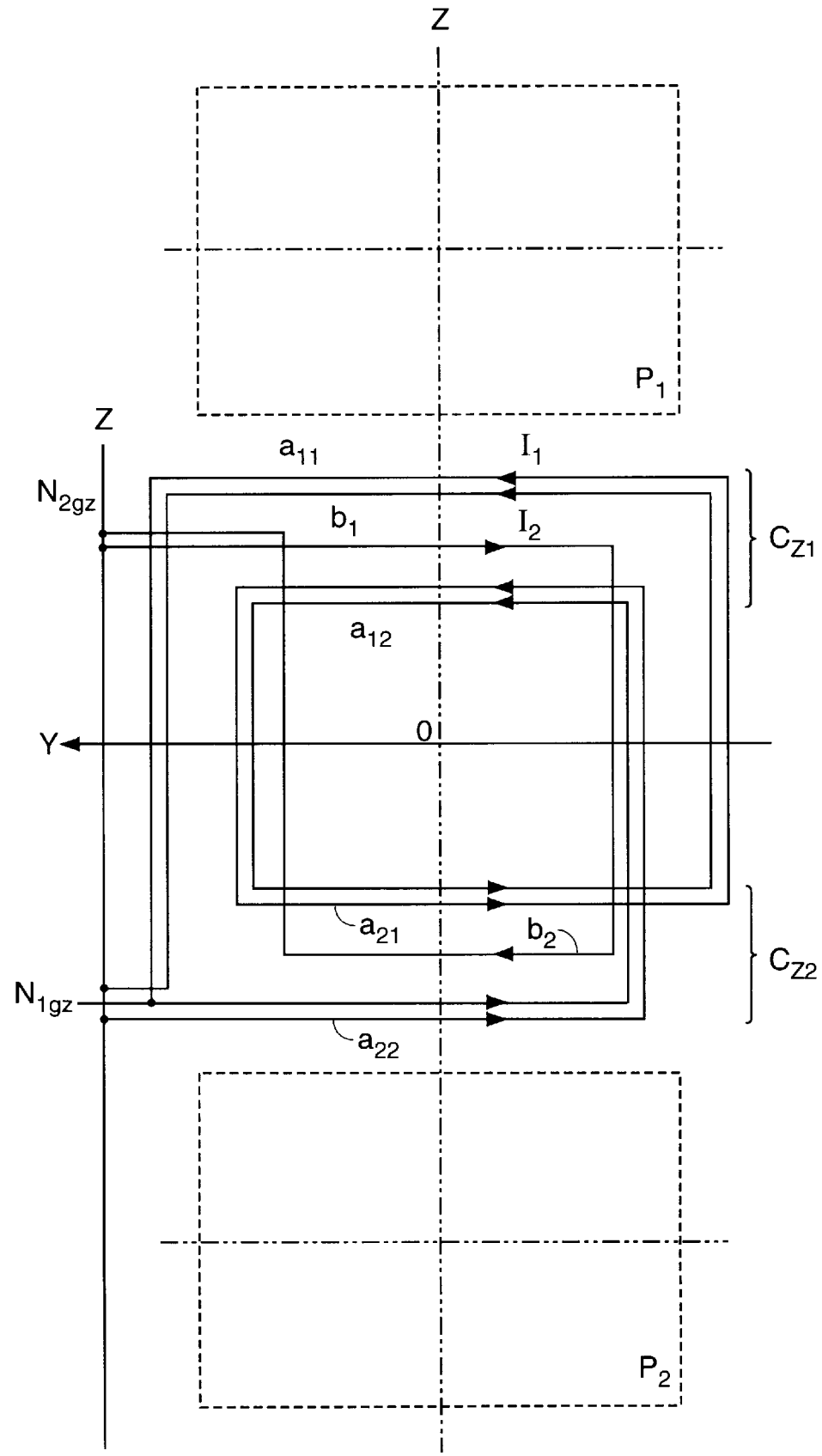
FIG. 15A is a schematic plan view illustration of a planar remote field z-gradient coil in the form of a rectangular loop array.

In accord with this invention, a planar remote field z-gradient coil can be constructed between the pole pieces $P_1, P_2$ of the primary magnet as illustrated by the wiring diagram in FIG. 15A. FIG. 15A shows a set of current wires $a_{11}$, $b_1$ and $a_{12}$ at positive values of z and a symmetric set of opposite polarity current wires $a_{22}$, $b_2$ and $a_{21}$, located at corresponding negative values of z. The current in wires $a_{11}, a_{12}$ have current in one direction with the bias wire set $b_1$ having current in the opposite direction. The wire sets $a_{21}, a_{22}$ and $b_2$ on the opposite side of the y-axis have currents flowing in the opposite directions to the currents in the corresponding wire sets $a_{11}, a_{12}$ and $b_1$. A remote z-gradient field is provided in the target background field. All of the current wires in sets "a" are preferably are connected, as illustrated, to be supplied by a single power source. Similar to the field produced by the y-gradient coil of FIG. 14A, these two sets of current wires produce a field maximum, each of opposite sign at the remote plane $x=x_o$ at different values of z. This produces the gradient field illustrated in FIG. 15B.

Figure 15B:
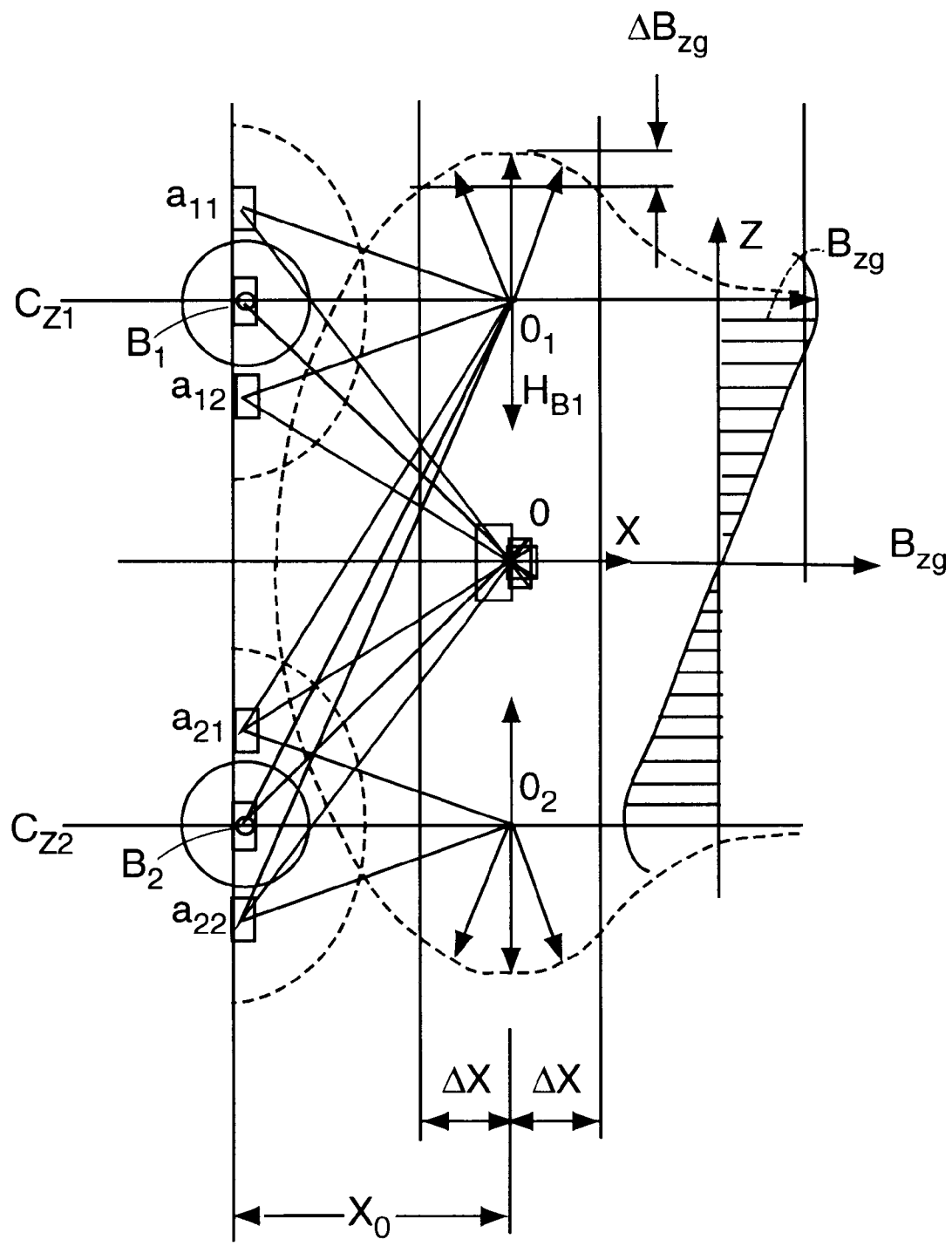
FIG. 15B is a schematic cross sectional view in the xz plane of the wires of the loop array of FIG. 15A and illustrates the remote z-gradient field provided by the z-gradient coil.

FIG. 15B shows a side cross sectional view of the z-gradient coil illustrating field line orientation in the xz plane at y=0 of the wire sets illustrated in FIG. 15A with a plot of the z component of the z-gradient field $B_{zg}$ illustrating a substantially constant gradient over a range of z.

Figure 16A:
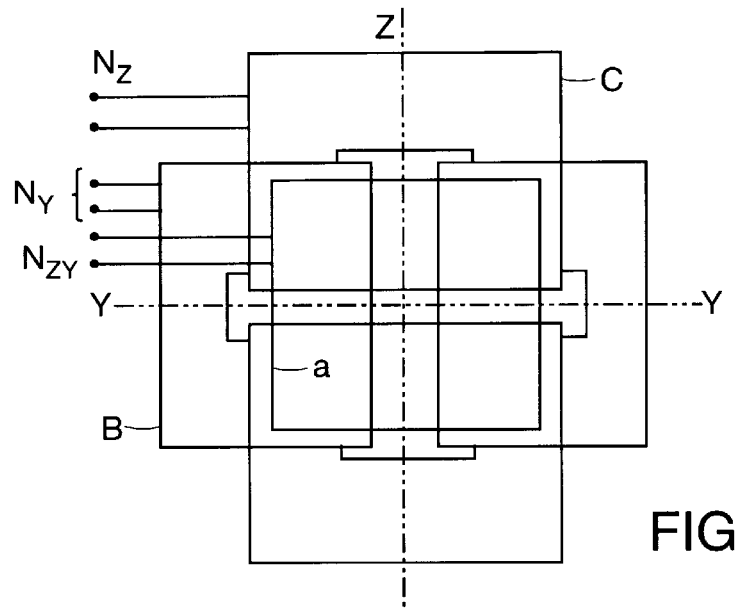
FIG. 16A is a schematic illustration of three rf coils for excitation and detection of the nuclear magnetic resonance signal, which provide a remote x-directional rf field orthogonal to the z directional background field.
Figure 16B:
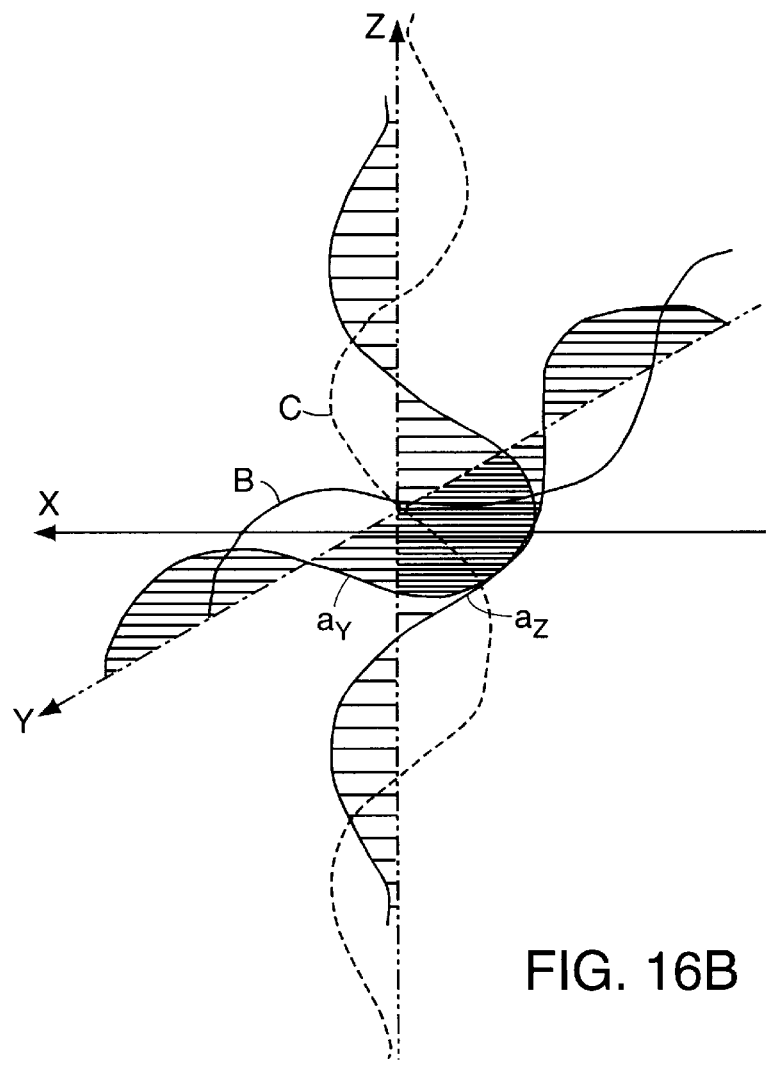
FIG. 16B illustrates the x-directional field provided by the rf coil of FIG. 16A which is orthogonal to the z-axis.

As illustrated in FIG. 16A, a planar rf coil set useful in connection with the present invention is illustrated, which provides a remote region of approximate rf field homogeneity wherein the major components are oriented orthogonal to the z component of the background field, i.e., oriented in the x-direction. The three coils illustrated can be used singly or in combination with each other to produce an rf field perpendicular to the $B_o$ field in different regions of the target volume. By varying the number of coaxial current loops in the rf coils, which can be in different but parallel planes, the region of the x-oriented rf field homogeneity can be positioned in the region of remote field homogeneity of the background field. FIG. 16B illustrates the x-directional field provided by the rf coil of FIG. 6A, which is orthogonal to the z-axis. However, it will be appreciated by those skilled in the art that the rf field must be perpendicular to the $B_o$ field (which for discussion in this specification is in the z direction). Thus, an rf field in the y direction can also be illustrated in a similar manner and provided used for excitation and detection of the nuclear magnetic resonance signal.

The open magnet configuration providing a remote background field for MRI can be made in any size to provide whole body capability or a portable system for more localized imaging. Various well known shimming means such as shimming coils (not shown) can also be used to define and position the remote region of background field homogeneity.

Planar xyz gradient and rf coils are positioned below the patient table and can extend over the surface of the main pole pieces 63 and 64. The particular geometry and size of the gradient and rf coils must be optimized for each particular application, as is well known in the art.

The invention has been described in detail with reference to preferred embodiments thereof. However, it will be appreciated that, upon consideration of the present specification and drawings, those skilled in the art may make modifications and improvements within the spirit and scope of this invention as defined by the claims. For example, other magnets such as iron core electromagnets can be use for providing the bias field.

I claim:

1. A magnet resonance imaging system comprising an open solenoidal magnet structure that provides a remote region of background field homogeneity for imaging, spatial encoding gradient coils and an rf coil, wherein the open magnet comprises:

a pair of primary solenoidal coils, each solenoidal coil having a solenoidal center axis, and a bias coil system located within the primary coil geometry, the primary and bias coils emitting an additive flux in an imaging region to generate a resulting background magnetic field that is perpendicular to the solendoidal axes and provides a remote region of substantial field homogeneity.

2. The magnet resonance imaging system according to claim 1, wherein the primary solenoidal coils comprises superconductive coils.

3. The magnet resonance imaging system according to claim 1, wherein the primary solenoidal coils comprises resistive coils.

4. The magnet resonance imaging system according to claim 1, wherein the primary coils are separated and the bias coil system is located between the primary coils.

5. The magnet resonance imaging system according to claim 4, wherein the bias coil system comprises a solenoidal coil oriented orthogonal to the primary coils.

6. The magnet resonance imaging system according to claim 4, wherein the bias coil system comprises a pair solenoidal bias coils oriented parallel to the primary coils.

7. The magnet resonance imaging system according to claim 1, wherein the primary coils are positioned adjacent each other and the bias coil system is located within the air space inside the primary coils.

8. The magnet resonance imaging system according to claim 1, wherein portions of the two primary coils overlap and the bias coil system is located within the air space inside the primary coils.

9. The magnet resonance imaging system according to claim 1, further comprising a ferromagnetic container which, except for a side adjacent said remote region of substantial field homogeneity, at least partially surrounds the remaining sides the coils, thereby providing a magnetic shunt and reducing external flux leakage.

10. The magnet resonance imaging system according to claim 1, further comprising a ceiling shielding system located in a ceiling above the open solenoidal magnet structure; said shielding system comprising:

a pair of planar primary shielding coils, and a pair of planar bias shielding coils located between the primary shielding coils, the bias shielding coils having a current direction opposite to the current direction of the primary shielding coils to provide a flux contributing to the flux provided by the primary shielding coils.

11. A magnet resonance imaging system comprising two open solenoidal magnet structures, each providing a remote region of background field homogeneity for imaging, spatial encoding gradient coils and an rf coil, wherein the two open magnet structures face each other so that the remote region for each magnet structure is between the two magnets, each open magnet structure comprising:

a pair of primary solenoidal coils, each solenoidal coil having a solenoidal center axis, and a bias coil system located within the primary coil geometry, the primary and bias coils emitting a total additive flux in an imaging region to generate a resulting background magnetic field that is perpendicular to the solendoidal axes and provides a remote region of substantial field homogeneity.

12. A magnet resonance imaging system comprising an open solenoidal magnet structure that provides a remote region of background field homogeneity for imaging, spatial encoding gradient coils and an rf coil, wherein the open magnet comprises:

a first and a second primary solenoidal coil, each primary solenoidal coil having a solenoidal center axis, the first primary solenoidal coil having pole that are oriented opposite to the poles of the second primary solenoidal coil, and a bias coil system located within the primary coil geometry, the primary and bias coils emitting an additive flux in an imaging region to generate a resulting background magnetic field that provides a remote region of substantial field homogeneity.

* * * * *